(12) United States Patent
Ikeda et al.

(10) Patent No.: US 9,251,896 B2
(45) Date of Patent: Feb. 2, 2016

(54) VARIABLE RESISTANCE NONVOLATILE MEMORY DEVICE AND METHOD FOR WRITING INTO THE SAME

(71) Applicant: PANASONIC CORPORATION, Osaka (JP)

(72) Inventors: Yuichiro Ikeda, Hyogo (JP); Kazuhiko Shimakawa, Osaka (JP); Yoshikazu Katoh, Osaka (JP); Ken Kawai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 4 days.

(21) Appl. No.: 14/257,924

(22) Filed: Apr. 21, 2014

(65) Prior Publication Data

US 2014/0321196 A1    Oct. 30, 2014

(30) Foreign Application Priority Data

Apr. 26, 2013  (JP) .................................. 2013-093999

(51) Int. Cl.
    *G11C 13/00*    (2006.01)

(52) U.S. Cl.
    CPC ........ *G11C 13/0064* (2013.01); *G11C 13/0069* (2013.01); *G11C 2013/0073* (2013.01); *G11C 2013/0092* (2013.01); *G11C 2213/79* (2013.01)

(58) Field of Classification Search
    CPC .... G11C 13/00; G11C 13/64; G11C 13/0069; G11C 13/0097
    USPC ........................................................ 365/148
    See application file for complete search history.

(56) References Cited

U.S. PATENT DOCUMENTS

| | | | | |
|---|---|---|---|---|
| 7,911,824 B2 * | 3/2011 | Kawai et al. | .................. | 365/148 |
| 8,213,214 B2 * | 7/2012 | Tsushima et al. | ............. | 365/148 |
| 8,363,447 B2 * | 1/2013 | Tsushima et al. | ............. | 365/148 |
| 2008/0316792 A1 * | 12/2008 | Philipp | ........................ | 365/148 |
| 2009/0283736 A1 | 11/2009 | Kanzawa et al. | | |
| 2010/0188885 A1 * | 7/2010 | Toda et al. | ..................... | 365/148 |
| 2010/0207094 A1 | 8/2010 | Kanzawa et al. | | |
| 2011/0294259 A1 | 12/2011 | Kanzawa et al. | | |
| 2012/0069633 A1 * | 3/2012 | Katoh | ........................... | 365/148 |
| 2012/0201077 A1 * | 8/2012 | Nagao | ...................... | 365/185.03 |
| 2013/0148408 A1 | 6/2013 | Kawai et al. | | |
| 2013/0290808 A1 * | 10/2013 | Mu et al. | ....................... | 714/763 |
| 2014/0177316 A1 * | 6/2014 | Otsuka et al. | ................. | 365/148 |

FOREIGN PATENT DOCUMENTS

| | | |
|---|---|---|
| JP | 2000-090675 A | 3/2000 |
| JP | 2009-026364 A | 2/2009 |
| JP | 2012-027962 A | 2/2012 |
| WO | 2008/149484 A1 | 12/2008 |
| WO | 2009/050833 A1 | 4/2009 |
| WO | 2013/021648 A1 | 2/2013 |

* cited by examiner

*Primary Examiner* — Son Mai
*Assistant Examiner* — Muna A Techane
(74) *Attorney, Agent, or Firm* — McDermott Will & Emery LLP

(57) ABSTRACT

In a method for writing into a variable resistance nonvolatile memory device according to one aspect of the present disclosure, a verify write operation of newly applying a voltage pulse for changing a resistance state is performed on a variable resistance element which does not satisfy a determination condition for verifying that the resistance state has been changed despite application of a voltage pulse for changing the resistance state, and the determination condition in the verify write operation is relaxed when an average number of times of verify write operation, having already been performed on all or part of a plurality of variable resistance elements that are targets for write operation, exceeds a predetermined number of times.

18 Claims, 24 Drawing Sheets

FIG. 12

| Operation mode / Node | Low resistance writing | | | High resistance writing | | | Read |
|---|---|---|---|---|---|---|---|
| | Low resistance processing | | Verify determin-ation | High resistance processing | | Verify determin-ation | |
| | Positive pulse application | Negative pulse application | Read | Negative pulse application | Positive pulse application | Read | |
| WL | Vw (2.8V) | Vw (2.8V) | VDD (1.8V) | Vw (2.8V) | Vw (2.8V) | VDD (1.8V) | VDD (1.8V) |
| SL | 0V | Vs (2.8V) | 0V | Vs (1.0V) | 0V | 0V | 0V |
| BL | Vb(1.1V) 0V⎴ | Vb(2.8V) 0V⎵ | Vread (0.4V) | Vb(1.0V) 0V⎴ | Vb(2.2V) 0V⎴ | Vread (0.4V) | Vread (0.4V) |

VARIABLE RESISTANCE NONVOLATILE MEMORY DEVICE AND METHOD FOR WRITING INTO THE SAME

RELATED APPLICATIONS

This application claims the benefit of Japanese Application No. 2013-093999, filed on Apr. 26, 2013, the disclosure of which Application is incorporated by reference herein.

BACKGROUND

1. Technical Field

The present invention relates to a variable resistance nonvolatile memory device and a method for writing into the same. More specifically, the present invention relates to a variable resistance nonvolatile memory device which performs a verify write operation, and a method for writing into the same.

2. Description of the Related Art

Unexamined Japanese Patent Publication No. 2012-27962 discloses a technique concerning a NAND flash memory. A nonvolatile memory device described in Unexamined Japanese Patent Publication No. 2012-27962 has a memory cell array formed by arranging in a matrix shape a plurality of nonvolatile memory cells where a threshold during data-erasing is included in a first threshold distribution and a threshold during data-writing is included in a second threshold distribution. During data-erasing, an erase voltage is applied to a nonvolatile memory cell from which data is to be erased, and a threshold during data-erasing is shifted so as to be included in the first threshold distribution. The shift of the threshold of the nonvolatile memory cell from which data is to be erased into the first threshold distribution is verified by an erase verify operation with an erase verify level taken as an index. During data-writing, a writing voltage is applied to a nonvolatile memory cell in which data is to be written, and a threshold during data-writing is shifted so as to be included in the second threshold distribution. The shift of the threshold of the nonvolatile memory cell in which data is to be written into the second threshold distribution is verified by a write verify operation with a write verify level taken as an index. Then, the erase verify level and the write verify level are adaptively changed based on at least one of a state of the erase operation and a state of the write operation.

PCT International Publication Nos. WO2008/149484 and WO2009/050833 each disclose a variable resistance nonvolatile memory element using tantalum oxide (TaO) for a variable resistance layer.

SUMMARY

One non-limiting and exemplary embodiment realize both improvement in data-record/read accuracy and improvement in data-write speed in a variable resistance nonvolatile memory device for performing a verify write operation.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

one aspect of a method for writing according to the present disclosure is a method for writing into a variable resistance nonvolatile memory device including a memory cell array which has a plurality of memory cells including variable resistance elements, wherein the variable resistance element has characteristics of changing, upon application of a first voltage pulse, from a first resistance state which is used for storing first information to a second resistance state which is used for storing second information and has a lower resistance value than that in the first resistance state, and of changing from the second resistance state to the first resistance state upon application of a second voltage pulse, a verify write operation of newly applying a voltage pulse for changing the resistance state is performed on a variable resistance element which does not satisfy a determination condition for verifying that the resistance state has been changed despite application of a voltage pulse for changing the resistance state, and the determination condition in the verify write operation is relaxed when an average number of times of verify write operations, having already been performed on all or part of a plurality of variable resistance elements that are write objects, exceeds a predetermined number of times.

The present disclosure can also be realized as a variable resistance nonvolatile memory device provided with a pulse application device which executes the above write method.

According to the variable resistance nonvolatile memory device of the present disclosure and the method for writing into the same, it is possible to realize both improvement in data-record/read accuracy and improvement in data-write speed.

BRIEF DESCRIPTION OF THE DRAWINGS

FIG. 12 is a table showing a set voltage of each operation in the method for writing into the variable resistance nonvolatile memory device according to the third reference mode;

DETAILED DESCRIPTION

A keen examination has been performed so as to realize both improvement in data-record/read accuracy and improvement in data-write speed in a variable resistance nonvolatile memory device. The following findings have consequently been obtained.

In recent years, the minimum process size of the nonvolatile memory device is increasingly reduced, and with progress in microfabrication thereof, deterioration in reliability of a memory cell can be greatly problematic.

In order to improve the reliability, the following is considered: after an operation for writing information in an element has been performed, information held in the element is verified, and when desired information has not been written, the write operation is executed again, namely a verify write operation is introduced.

In a NAND flash memory, deterioration progresses in the form of a resistance state uniformly shifting to the high-resistance side or the low-resistance side. For this reason, it is possible to deal with deterioration by such a method as in Unexamined Japanese Patent Publication No. 2012-27962. That is, it is possible to deal with deterioration by the method of uniformly changing an erase (corresponding to one of low resistance writing and high resistance writing) verify level and a write (corresponding to the other) verify level in the same direction just by Δvrfy.

However, in the variable resistance nonvolatile memory element, deterioration occurs in a direction where a resistance value in the high-resistance state becomes lower and a resistance value in the low-resistance state becomes higher. Therefore, just by uniformly changing the verify level as in Unexamined Japanese Patent Publication No. 2012-27962, either one of high resistance writing and low resistance writing is improved, but the other cannot be improved.

In the variable resistance nonvolatile memory element, there is seen a phenomenon of variations in resistance value detected after write. For example, even in the element on which write has been performed in the high-resistance state by use of a voltage pulse having the same voltage and the same pulse width, a resistance value detected thereafter greatly varies, depending on the elements.

Figure 15:
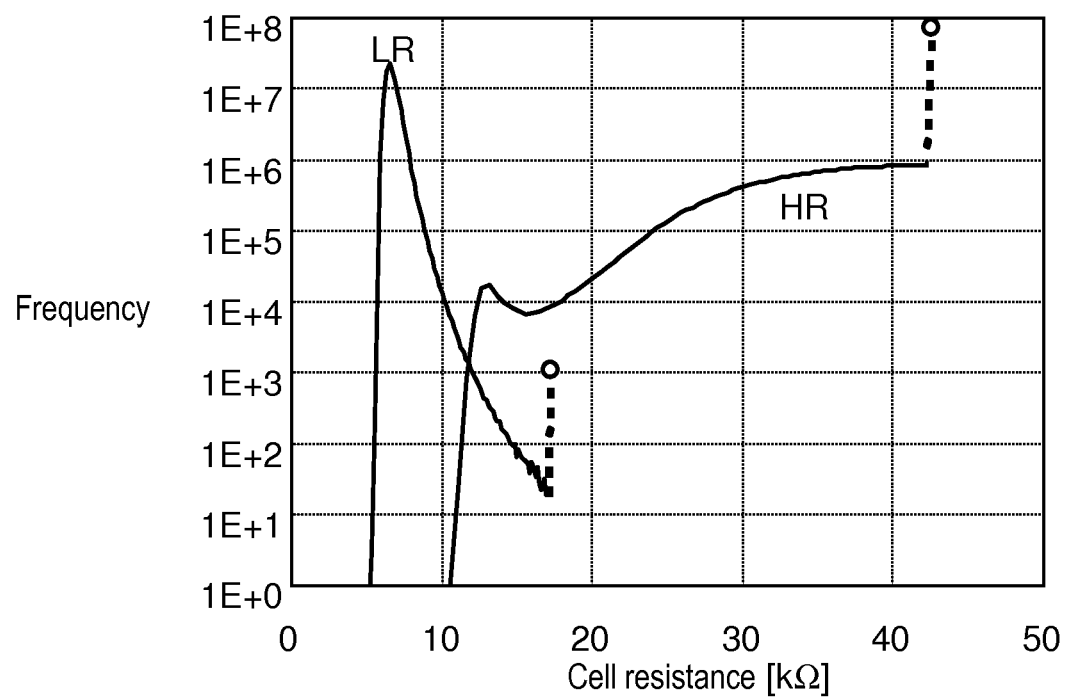
FIG. 15 is a diagram showing a resistance value frequency distribution in a case where high resistance writing and low resistance writing is repeated 50000 times while a verify operation is not performed in the variable resistance nonvolatile memory device (1 k bits) according to the third reference mode.

FIG. 15 shows one example of a resistance value frequency distribution of an element where write is performed in each of the high-resistance state (HR) and the low-resistance state (LR). As can be seen in FIG. 15, the resistance value greatly varies both in the high-resistance state (HR) and in the low-resistance state (LR). FIG. 15 is data concerning a bipolar variable resistance nonvolatile memory element. Further, even in a unipolar variable resistance nonvolatile memory element, when a variable resistance element is one having a filament structure and uses a defect for changing resistance, similar variations in resistance value occurs (refer to e.g., Lee, S. B. et al., Applied Physics Letters, vol. 95, p. 122112 (2009)).

The variations increase along with deterioration in element. That is, in the variable resistance nonvolatile memory element, repeating the write operation in the high-resistance state and the low-resistance state leads to deterioration in performance of the memory cell, and hence the resistance value in the high-resistance state becomes lower or the resistance value in the low-resistance state becomes higher. Deterioration in element becomes remarkable with increase in number of times of write operation, leading to an increase in number of times of verify Fail, namely the number of times of re-application of a voltage pulse in the verify write operation, thereby to cause a problem of a decreased write speed.

Figure 17:
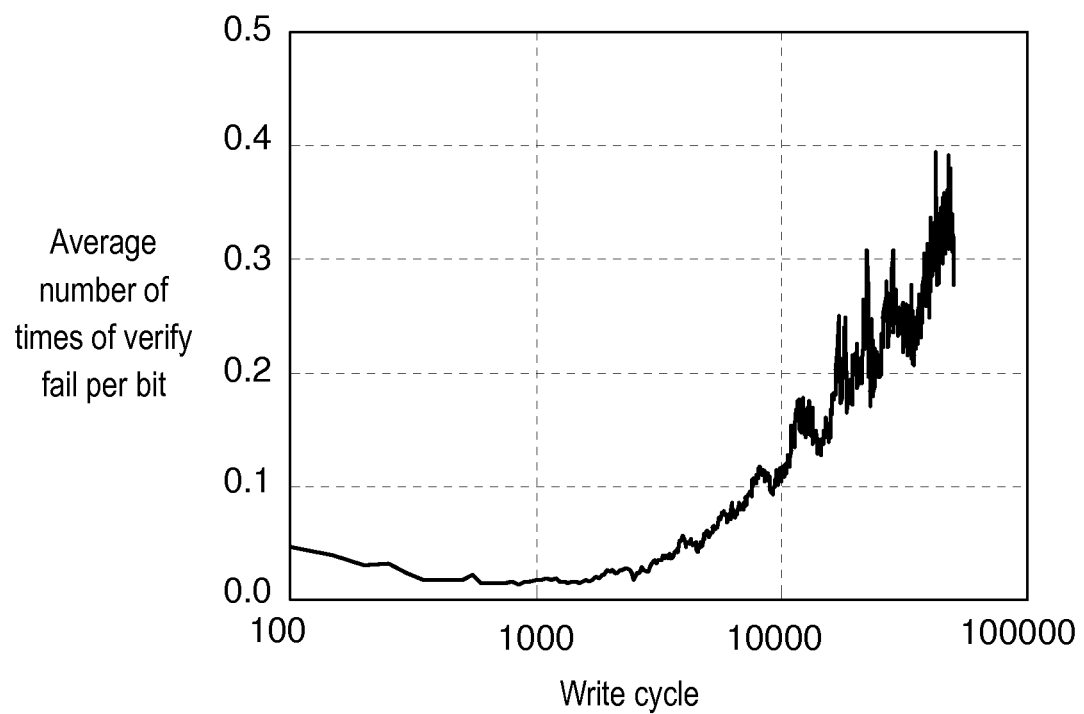
FIG. 17 is a diagram showing a shift of an average number of times per bit in the verify write operation in a case where high resistance writing and low resistance writing is repeated in the variable resistance nonvolatile memory device according to the third reference mode.

FIG. 17 is a diagram showing one example of the relation between the number of write cycles and the number of times of verify Fail in the case of a determination condition being constant. As shown in FIG. 17, with increase in the number of write cycles, an average number of times of verify Fail per bit abruptly increases.

In order to deal with such a problem, it has been conceived that the determination condition in the verify write operation is relaxed when the number of times of verify Fail reaches a predetermined threshold. In such a configuration, write in the element is completed more rapidly, to improve the write speed. Meanwhile, it is possible to improve the data-record/read accuracy as compared with a configuration where the verify operation is not executed at all. That is, it is possible to realize both improvement in data-record/read accuracy and improvement in data-write speed.

With progress in deterioration, resistance value distributions get closer to or overlap each other, the distributions being of the element on which write has been performed in the high-resistance state and the element on which write has been performed in the low-resistance state. This results in deterioration in data-record/read accuracy. When such deterioration in accuracy is problematic, once the number of times of verify Fail reaches a predetermined upper limit, the determination condition with respect to the element may be made stricter or write in the element may be forbidden.

Hereinafter, embodiments of the present disclosure will be described with reference to the attached drawings.

Any of the embodiments described below is to show one specific example of the present disclosure. Numerical values, shapes, materials, constituents, arranged positions and connected forms of the constituents, steps, step sequences and the like shown in the following embodiments are mere examples and do not restrict the present disclosure. Further, out of the constituents in the following embodiments, a constituent not recited in an independent claim showing the top concept of the present disclosure will be described as an arbitrary constituent that constitutes the embodiment. Moreover, a description of constituents provided with the same reference numeral in the drawings may be omitted. Furthermore, the drawing is one schematically showing each constituent for the sake of facilitating understanding, and it may not accurately show a shape, a size ratio and the like. Additionally, in a manufacturing method, a sequence of each step and the like can be changed according to the need, and a known process can be added.

First Exemplary Embodiment

A method for writing into a variable resistance nonvolatile memory device of a first embodiment is a method for writing into a variable resistance nonvolatile memory device comprising a memory cell array which has a plurality of memory cells including variable resistance elements, wherein the variable resistance element has characteristics of changing, upon application of a first voltage pulse, from a first resistance state which is used for storing first information to a second resistance state which is used for storing second information and has a lower resistance value than that in the first resistance state, and of changing from the second resistance state to the first resistance state upon application of a second voltage pulse, a verify write operation of newly applying a voltage pulse for changing the resistance state is performed on a variable resistance element which does not satisfy a determination condition for verifying that the resistance state has been changed despite application of a voltage pulse for changing the resistance state, and the determination condition in the verify write operation is relaxed when an average number of times of verify write operations, having already been performed on all or part of a plurality of variable resistance elements that are targets for write operation, exceeds a predetermined number of times.

The variable resistance nonvolatile memory device of the first embodiment includes a memory cell array which has a plurality of memory cells including variable resistance elements, wherein the variable resistance element has characteristics of changing, upon application of a first voltage pulse by a pulse application device, from a first resistance state which is used for storing first information to a second resistance state which is used for storing second information and has a lower resistance value than that in the first resistance state, and of changing from the second resistance state to the first resistance state upon application of a second voltage pulse by the pulse application device. The variable resistance nonvolatile memory device further includes the pulse application device, which performs a verify write operation of newly applying a voltage pulse for changing the resistance state on a variable resistance element which does not satisfy a determination condition for verifying that the resistance state has been changed despite application of a voltage pulse for changing the resistance state, and relaxes the determination condition in the verify write operation when an average number of times of the verify write operations, having already been performed on all or part of a plurality of the variable resistance elements that are targets for write operation, exceeds a predetermined number of times. In such a configuration, it is possible to realize both improvement in data-record/read accuracy and improvement in data-write speed in the variable resistance nonvolatile memory device.

To "perform the verify write operation" does not necessarily mean not to complete the write operation on the variable resistance element until the determination condition for verifying that the resistance state has been changed is satisfied. In the case of not satisfying the determination condition for verifying that the resistance state has been changed, for example, when some condition is satisfied, the verify write operation may be suspended and the write operation on the variable resistance element may be completed.

To "relax the determination condition in the verify write operation" includes, for example, to decrease a resistance value to be a threshold for determining whether or not write in the high-resistance state has been completed, and to increase a resistance value to be a threshold for determining whether or not write in the low-resistance state has been completed.

A voltage pulse (initial pulse) that is applied to the variable resistance element so as to change the resistance state prior to the verify write operation may be the same as or different from a voltage pulse that is applied to the variable resistance element so as to change the resistance state in the verify write operation. For example, in the case of changing some variable resistance element from the low-resistance state to the high-resistance state, a high resistance writing pulse that is initially applied to the element and a low resistance writing pulse that is applied to the element in the verify write operation may be the same, or may be different in a voltage, a pulse width and the like.

Further, a voltage pulse that is applied to the variable resistance element for changing the resistance state in each verify write operation may be the same or the different from each other. For example, in the case of changing some variable resistance element from the low-resistance state to the high-resistance state, a high resistance writing pulse that is applied to the element in a first verify write operation and a high resistance writing pulse that is applied to the element in a second verify write operation may be the same, or may be different in a voltage, a pulse width and the like.

In the above write method, an upper limit may be set to the number of times of verify write operations that are performed after relaxation of the determination condition.

In such a configuration, relaxing the determination condition can reduce the possibility that a window between the maximum value of the low-resistance state and the minimum value of the high-resistance state decreases without restrictions.

In the above write method, when an average number of times of the verify write operations performed after relaxation of the determination condition on all or part of a plurality of variable resistance elements to be targets for write operation, reaches the upper limit, the variable resistance element having reached the upper limit may not hereafter be taken as the target for write operation.

In such a configuration, an operation speed can be improved in preference to continuous use of the element having deteriorated.

In the above write method, when an average number of times of verify write operations performed after relaxation of the determination condition on all or part of a plurality of variable resistance elements to be the target for the write operation, reaches the upper limit, the determination condition may hereafter be returned to the determination condition before the relaxation with respect to the variable resistance element to be the target for the write operation.

When an average number of times of verify write operation reaches the upper limit after relaxation of the determination condition on the verify write operation, since verify cannot be performed on the relaxed determination condition for verify write, the determination condition is returned to the original determination condition for verify write to strongly perform verify, thus making it possible to seek extended lifetime of the variable resistance element. This allows a larger operation window to be ensured in preference to the operation speed.

[Device Configuration]

Figure 1:
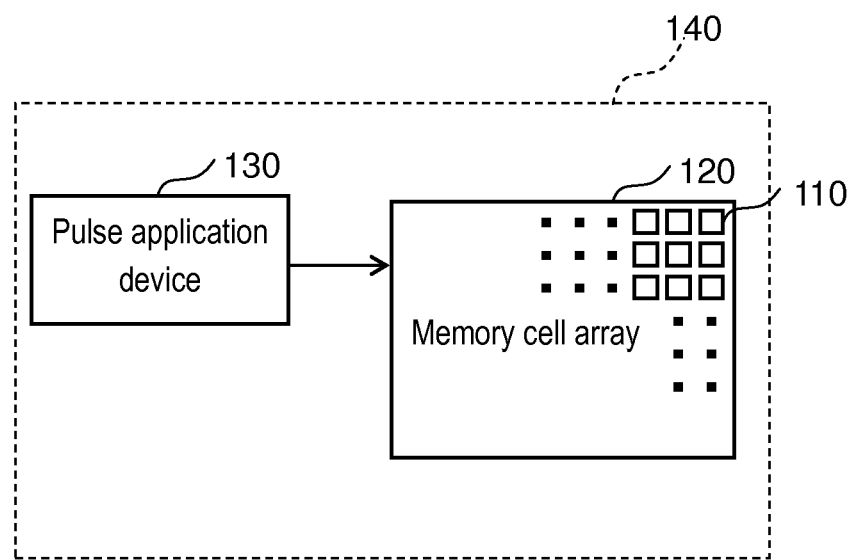
FIG. 1 is a block diagram showing one example of a schematic configuration of a variable resistance nonvolatile memory device according to a first embodiment.

FIG. 1 is a block diagram showing one example of a schematic configuration of the variable resistance nonvolatile memory device according to the first embodiment.

As in the example shown in FIG. 1, variable resistance nonvolatile memory device 140 of the first embodiment is provided with memory cell array 120 and pulse application device 130. Memory cell array 120 has a plurality of memory cells 110 including variable resistance elements 100.

Upon application of a first voltage pulse, variable resistance element 100 changes from a first resistance state which is used for storing first information to a second resistance state which is used for storing second information and has a lower resistance value than that in the first resistance state. Upon application of a second voltage pulse, it changes from the second resistance state to the first resistance state. A polarity of the first voltage pulse and a polarity of the second voltage pulse may be different or the same.

Figure 2:
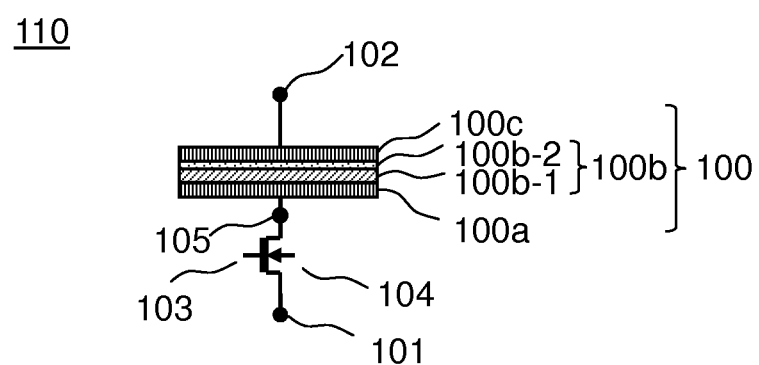
FIG. 2 is a schematic view showing one example of a schematic configuration of a memory cell provided in the variable resistance nonvolatile memory device according to the first embodiment.

FIG. 2 is a schematic view showing one example of a schematic configuration of a memory cell provided in the variable resistance nonvolatile memory device according to the first embodiment. In the example shown in FIG. 2, memory cell 110 of the first embodiment is provided with variable resistance element 100 and NMOS transistor 104. Variable resistance element 100 is formed by laminating first electrode 100a, variable resistance layer 100b and second electrode 100c.

Variable resistance layer 100b is interposed between first electrode 100a and second electrode 100c, and has a resistance value that reversibly changes based on an electrical signal given to between first electrode 100a and second electrode 100c. For example, variable resistance layer 100b reversibly shifts between the high-resistance state and the low-resistance state in accordance with a polarity of a voltage applied to between the first electrode 100a and the second electrode 100c. In the example shown in FIG. 2, variable resistance layer 100b is configured by laminating at least two layers; first variable resistance layer 100b-1 connected to first electrode 100a and second variable resistance layer 100b-2 connected to the second electrode. It is to be noted that variable resistance layer 100b may be configured of a single layer, or three or more layers.

First variable resistance layer 100b-1 is configured of an oxygen-deficient first metal oxide, and second variable resistance layer 100b-2 is configured of a second metal oxide which is lower in degree of oxygen deficiency than that of the first metal oxide. In second variable resistance layer 100b-2 of variable resistance element 100, a minute local region is formed in which the degree of oxygen deficiency reversibly changes in accordance with application of an electrical pulse. The local region is thought to include a filament made up of an oxygen defect site.

For example, the first metal oxide can be first tantalum oxide ($TaO_x$, where $0<x<2.5$). The second metal oxide can be second tantalum oxide ($TaO_y$, where $x<y$).

The term "degree of oxygen deficiency" refers to a ratio of an amount of oxygen which is deficient with respect to an amount of oxygen constituting an oxide having a stoichiometric composition (stoichiometric composition corresponding to a greatest resistance value in a case where there exist plural stoichiometric compositions) of each metal oxide. A metal oxide having a stoichiometric composition is more stable and has a greater resistance value than a metal oxide having another composition.

For example, in a case where the metal is tantalum (Ta), a tantalum oxide having a stoichiometric composition according to the above definition is $Ta_2O_5$, and therefore is expressed as $TaO_{2.5}$. The degree of oxygen deficiency of $TaO_{2.5}$ is 0%. The degree of oxygen deficiency of $TaO_{1.5}$, is $(2.5-1.5)/2.5=40\%$. An oxygen excess metal oxide has a negative value in degree of oxygen deficiency. In the present specification, the degree of oxygen deficiency is meant to include a positive value, 0 and a negative value unless otherwise explicitly noted.

An oxide which is lower in degree of oxygen deficiency is closer to the oxide having a stoichiometric composition and therefore has a greater resistance value, while an oxide which is higher in degree of oxygen deficiency is closer to the metal constituting the oxide and therefore has a smaller resistance value.

The term "oxygen content atomic percentage" refers to a ratio of the number of oxygen atoms to the total number of atoms. For example, the oxygen content atomic percentage of $Ta_2O_5$ is the ratio of the number of oxygen atoms to the total number of atoms (O/(Ta+O)) and is 71.4 atm %. Therefore, the oxygen content atomic percentage of the oxygen-deficient tantalum oxide is higher than 0 and lower than 71.4 atm %. For example, in a case where the metal constituting the first metal oxide layer and the metal constituting the second metal oxide layer are of the same kind, there is a correspondence between the oxygen content atomic percentage and the degree of oxygen deficiency. In this case, when the oxygen content atomic percentage of the second metal oxide is higher than the oxygen content atomic percentage of the first metal oxide, the degree of oxygen deficiency of the second metal oxide is lower than the degree of oxygen deficiency of the first metal oxide.

As the metal constituting the variable resistance layer 100b, a metal other than tantalum may be used. As the metal constituting the variable resistance layer, a transition metal, or aluminum (Al) may be used. As the transition metal, tantalum (Ta), titanium (Ti), hafnium (Hf), zirconium (Zr), niobium (Nb), tungsten (W), nickel (Ni), etc., may be used. Since the transition metal can assume plural oxidated states, different resistance states can be implemented by the redox reaction.

When x of $HfO_x$ of the composition of the first metal oxide is equal to or greater than 0.9 and equal to or less than 1.6, and y of $HfO_y$ of the composition of the second metal oxide is greater than x, in a case where the hafnium oxide is used, the resistance value of the variable resistance layer is allowed to change stably and at a high speed. In this case, the thickness of the second metal oxide may be set to 3 to 4 nm.

When x of $ZrO_x$ of the composition of the first metal oxide is equal to or greater than 0.9 and equal to or less than 1.4, and y of $ZrO_y$ of the composition of the second metal oxide is greater than x, in a case where the zirconium oxide is used, the resistance value of the variable resistance layer is allowed to change stably and at a high speed. In this case, the thickness of the second metal oxide may be set to 1 to 5 nm.

The first metal constituting the first metal oxide and the second metal constituting the second metal oxide may be different metals. In this case, the second metal oxide may be lower in degree of oxygen deficiency than the first metal oxide, i.e., higher in resistance than the first metal oxide. In such a configuration, a greater portion of a voltage applied between the first electrode and the second electrode to cause resistance change is fed to the second metal oxide, and the redox reaction taking place within the second metal oxide is facilitated.

In a case where the first metal constituting the first metal oxide which will become the first variable resistance layer and the second metal constituting the second metal oxide which will become the second variable resistance layer are materials which are different from each other, the standard electrode potential of the second metal may be lower than the standard electrode potential of the first metal. The standard electrode potential is a characteristic in which as its value is greater, the corresponding material is less easily oxidated. This allows the redox reaction to take place more easily in the second metal oxide which is relatively lower in standard electrode potential. It is estimated that in a resistance changing phenomenon, the redox reaction takes place in the minute localized region formed within the second metal oxide which is higher in resistance, the filament (conductive path) changes, and thereby its resistance value (degree of oxygen deficiency) changes.

For example, a stable resistance changing operation is attained by using an oxygen-deficient tantalum oxide ($TaO_x$) as the first metal oxide and by using a titanium oxide ($TiO_2$) as the second metal oxide. Titanium (standard electrode potential=−1.63 eV) has a lower standard electrode potential than tantalum (standard electrode potential=−0.6 eV). By using as the second metal oxide an oxide of a metal having a lower standard electrode potential than the metal of the first metal oxide, the redox reaction easily takes place within the second metal oxide. As another combination, an aluminum oxide ($Al_2O_3$) may be used as the second metal oxide which will become the high-resistance layer. For example, an oxygen-deficient tantalum oxide ($TaO_x$) may be used as the first metal oxide, and the aluminum oxide ($Al_2O_3$) may be used as the second metal oxide.

It is estimated that in a resistance changing phenomenon in the variable resistance layer having the stacked-layer structure, the redox reaction takes place in the minute localized region formed within the second metal oxide which is higher in resistance, the filament (conductive path) in the localized region changes, and thereby its resistance value changes.

Specifically, when a positive voltage is applied to the upper electrode 100c (second electrode) connected to the second metal oxide on the basis of the lower electrode 100a (first electrode), oxygen ions within the variable resistance layer are drawn toward the second metal oxide. Thereby, an oxidation reaction proceeds in the minute localized region formed within the second metal oxide, and the degree of oxygen deficiency reduces. This may result in a situation in which connection of the filament in the localized region does not easily occur, and the resistance value increases.

Conversely, when a negative voltage is applied to the upper electrode 100c (second electrode) connected to the second metal oxide on the basis of the lower electrode 100a (first electrode), the oxygen ions within the second metal oxide are forced to migrate toward the first metal oxide. Thereby, a reduction reaction proceeds in the minute localized region formed within the second metal oxide, and the degree of oxygen deficiency increases. This may result in a situation in which connection of the filament in the localized region easily occurs, and the resistance value decreases.

The upper electrode 100c (second electrode) connected to the second metal oxide which is lower in degree of oxygen deficiency comprises a material which is higher in standard electrode potential than the metal constituting the second metal oxide and the material constituting the lower electrode 100a (first electrode), for example, platinum (Pt), iridium (Ir), and palladium (Pd). The lower electrode 100a (first electrode) connected to the first metal oxide which is higher in degree of oxygen deficiency may comprise for example, a material which is lower in standard electrode potential than the metal constituting the first metal oxide, such as tungsten (W), nickel (Ni), tantalum (Ta), titanium (Ti), aluminum (Al), a tantalum nitride (TaN), and a titanium nitride (TiN). The standard electrode potential is a characteristic in which as its value is greater, the corresponding material is less easily oxidated.

When a standard electrode potential of the upper electrode 100c (second electrode) is V2, a standard electrode potential of the metal constituting the second metal oxide is Vr2, a standard electrode potential of the metal constituting the first metal oxide is Vr1, and a standard electrode potential of the lower electrode 100a (first electrode) is V1, Vr2<V2 and V1<V2 may be satisfied. Furthermore, V2>Vr2 and Vr1≧V1 may be satisfied.

By the above described configuration, a redox reaction takes place selectively in a region within the second metal oxide which is in the vicinity of the interface between the second electrode and the second metal oxide, and hence a stable resistance changing phenomenon is attained.

First electrode terminal 105 is pulled out from first electrode 100a, and second electrode terminal 102 is pulled out from second electrode 100c. Further, NMOS transistor 104 as a selected transistor (one example of a switch element) is provided with gate terminal 103. First electrode terminal 105 of variable resistance element 100 is connected in series with a source region or a drain (N+diffusion) region of NMOS transistor 104, and the other drain region or source (N+diffusion) region which is not connected with variable resistance element 100 is pulled out as first electrode terminal 101. A substrate terminal is connected to a ground potential. Here, second variable resistance layer 100b-2 with high resistance is arranged on the second electrode terminal 102 side which is the opposite side to NMOS transistor 104.

Further, in the memory cell shown in FIG. 2, when a voltage (low resistance writing voltage pulse) not lower than a predetermined voltage (e.g., first threshold voltage) is applied to first electrode terminal 101 with second electrode terminal 102 taken as a reference, reduction occurs in the vicinity of the interface between second electrode 100c and second variable resistance layer 100b-2, and variable resistance element 100 shifts to the low-resistance state. On the other hand, when a voltage (low resistance writing voltage pulse) not lower than another predetermined voltage (e.g., second threshold voltage) is applied to second electrode terminal 102 with first electrode terminal 101 taken as a reference, oxidation occurs in the vicinity of the interface between second electrode 100c and second variable resistance layer 100b-2, and variable resistance element 100 shifts to the high-resistance state. Here, an application direction of the low resistance writing voltage pulse is defined as a negative voltage direction, and an application direction of the high resistance writing voltage pulse is defined as a positive voltage direction. That is, variable resistance element 100 of the present embodiment can be a bipolar variable resistance element. It is to be noted that variable resistance element 100 may be a unipolar variable resistance element.

Memory cell array 120 can be configured to array in a matrix shape memory cells, each so-called a 1T1R type formed by connecting a MOS transistor in series with a variable resistance element at a position in the vicinity of an intersection point of a bit line and a word line arranged so as to be orthogonal to each other. In the 1T1R type, one end of a two-terminal variable resistance element can be connected to the bit line or a source line. The other end can be connected to a drain or a source of the transistor. A gate of the transistor can be connected to the word line. The other end of the transistor can be connected to the source line or the bit line which is not connected with one end of the variable resistance element. The source line can be arranged in parallel with the bit line or the word line.

Memory cell array 120 can be configured to array in a matrix shape cross-point memory cells, each so-called a 1D1R type formed by connecting a diode in series with a variable resistance element at a position of an intersection point of a bit line and a word line arranged so as to be orthogonal to each other.

Pulse application device 130 performs a verify write operation. The verify write operation is an operation of newly applying a voltage pulse for changing the resistance state to variable resistance element 100 which does not satisfy a determination condition for verifying that the resistance state has been changed despite application of the voltage pulse for changing the resistance state. Application of the voltage pulse for changing the resistance state may, for example, be repeated until the determination condition is satisfied or may be suspended when some condition is satisfied.

Pulse application device 130 relaxes the determination condition in the verify write operation when the number of times of verify write operations performed on a predetermined number of variable resistance elements 100 to be targets for write operation, exceeds a predetermined number of times.

[Method for Writing (Operation Method for Variable Resistance Nonvolatile Memory Device)]

Figure 3:
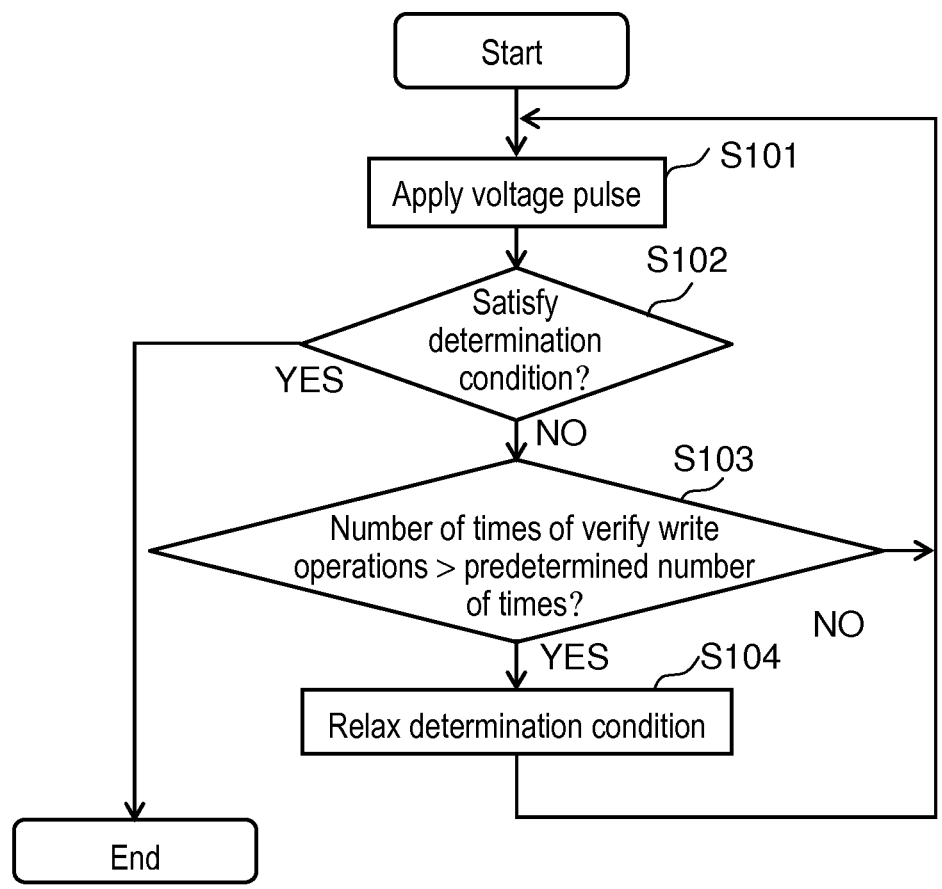
FIG. 3 is a flowchart showing one example of a method for writing into the variable resistance nonvolatile memory device according to the first embodiment.

FIG. 3 is a flowchart showing one example of the write method for the variable resistance nonvolatile memory device according to the first embodiment. An operation shown in FIG. 3 can be executed by control of pulse application device 130.

When data-write in variable resistance nonvolatile memory device 140 is started (Start), first, a voltage pulse is applied to variable resistance element 100 to be targets for write operations (Step S101).

Next, it is determined whether or not variable resistance element 100 applied with the voltage pulse satisfies the determination condition (Step S102). Specifically, for example, a resistance value of the variable resistance element applied with the voltage pulse is read by pulse application device 130, and a magnitude correlation with a predetermined threshold is determined by use of a sense amplifier. When the determination result is YES, data-write in variable resistance nonvolatile memory device 140 is completed (End).

When the determination result of Step S102 is No, it is determined whether or not the number of times of verify write operations exceeds a predetermined number of times (Step S103).

The number of times of verify write operations may, for example, be the number of voltage pulses applied to the same variable resistance element after the start of data-write, or the number of times of NO in the determination of Step S103. The number of times of verify write operations may be a sum of voltage pulses applied to a plurality of variable resistance elements which are the write objects after the start of data-write. Further, the number of times of verify write operations may be a sum of number of times of NO in the determination of Step S103, or may be an average value of the number of times of NO in the determination of Step S103 per variable resistance element.

The number of times of verify write operations may, for example, be stored in a data latch or the like provided in variable resistance nonvolatile memory device 140.

When the determination result of Step S103 is NO, the processing returns to Step S101, and the voltage pulse is again applied to variable resistance element 100 to be the targets for write operations.

When the determination result of Step S103 is YES, the determination condition of Step S102 is relaxed (S104), and the processing returns to Step S101, where the voltage pulse is again applied to variable resistance element 100 to be the targets for write operations. In this case, determination that is subsequently performed in Step S102 is executed using the relaxed determination condition. For this reason, the verify write operation is completed early, thereby to improve a write speed.

The determination condition may be relaxed with respect to each of individual variable resistance elements, or may be relaxed with respect to a plurality of variable resistance elements each (every write block).

(First Reference Mode)

The following first reference mode is to relax the determination condition in accordance with the number of times of verify write operations in the case of performing write for changing one variable resistance element to the low-resistance state.

A write method for a variable resistance nonvolatile memory device of the first reference mode is the write method for the variable resistance nonvolatile memory device of the first embodiment, wherein a threshold resistance value which is higher than a first threshold resistance value is taken as a second threshold resistance value, the verify write operation is to read a resistance value of the variable resistance element after application of the first voltage pulse, and again apply the first voltage pulse to the variable resistance element whose read resistance value has been determined to be higher than the first threshold resistance value, and in the verify write operation, in a case where the number of times of verify write operations, having already been performed on one variable resistance element which is a write object, exceeds a first threshold number of times, when the resistance value of the variable resistance element after application of the first voltage pulse is higher than the second threshold resistance value, the first voltage pulse is newly applied to the variable resistance element.

In other words, the write method for the variable resistance nonvolatile memory device of the first reference mode is the write method for the variable resistance nonvolatile memory device of the first embodiment, wherein a threshold resistance value which is higher than a first threshold resistance value is taken as a second threshold resistance value, the verify write operation is to read a resistance value of the variable resistance element after application of the first voltage pulse, and again apply the first voltage pulse to the variable resistance element whose read resistance value has been determined to be higher than the first threshold resistance value, and in the verify write operation, in a case where the number of times of verify write operations, having already been performed on one variable resistance element which is a target for write operations, exceeds a first threshold number of times, unless the resistance value of the variable resistance element after application of the first voltage pulse is higher than the second threshold resistance value, the first voltage pulse is not applied to the variable resistance element.

The variable resistance nonvolatile memory device of the first reference mode is the variable resistance nonvolatile memory device of the first embodiment, and the pulse application device executes the above write method.

[Device Configuration]

A configuration of the variable resistance nonvolatile memory device of the first reference mode can be made similar to that of the variable resistance nonvolatile memory device of the first embodiment except for the operation of the pulse application device (the operation method for the variable resistance nonvolatile memory device). Hence, a constituent which is common between the first embodiment and the first reference mode is provided with the same reference numeral and name, and a detailed description thereof is omitted.

[Method for Writing (Method for Operating for Variable Resistance Nonvolatile Memory Device)]

Figure 4:
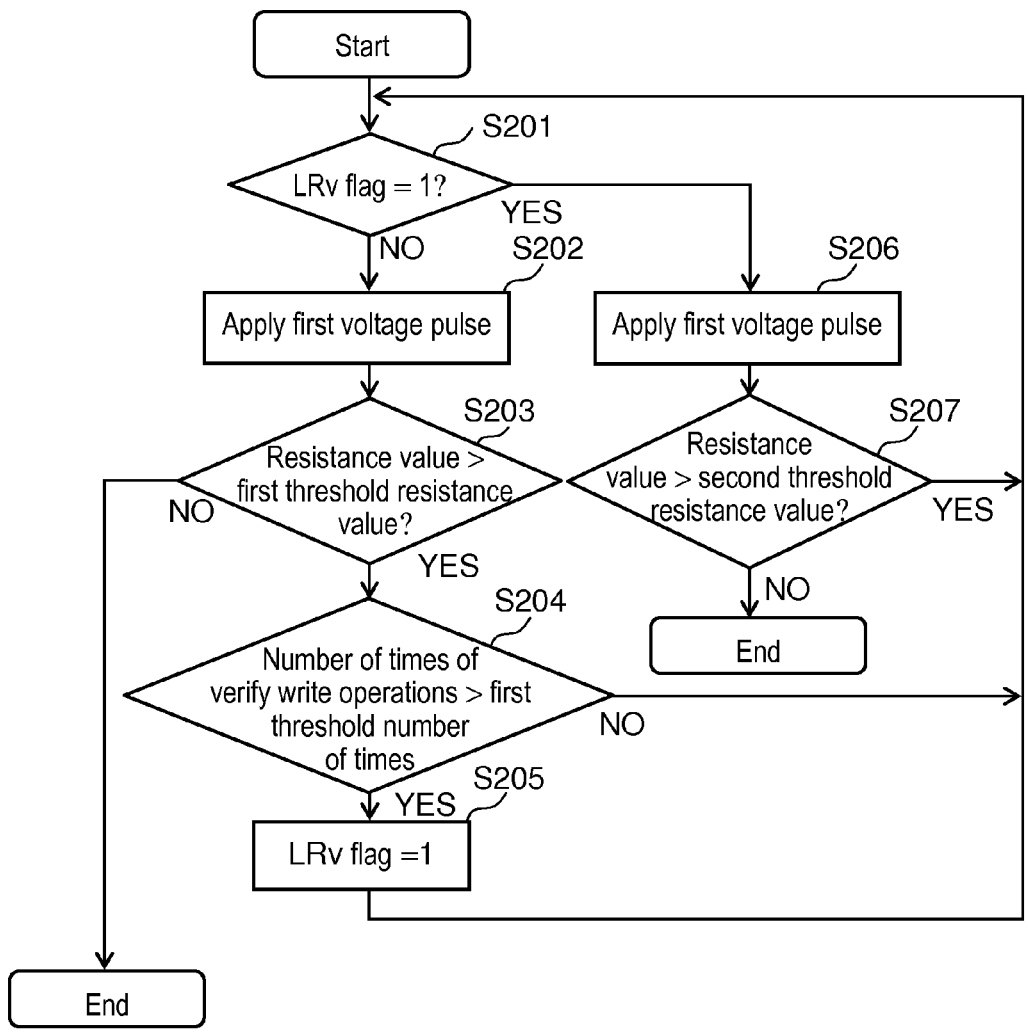
FIG. 4 is a flowchart showing one example of a method for writing into a variable resistance nonvolatile memory device according to a first reference mode.

FIG. 4 is a flowchart showing one example of the method for writing for the variable resistance nonvolatile memory device according to the first reference mode. An operation shown in FIG. 4 can be executed by control of pulse application device 130.

When data-write in variable resistance nonvolatile memory device 140 is started (Start), first, a value of a LRv flag indicating whether or not to relax the determination condition is checked (Step S201). The LRv flag is 0 in an initial state.

When the value of the LRv flag is 0 (NO in S201), the first voltage pulse is applied to variable resistance element 100 to be the targets for write operations (Step S202).

Next, it is determined whether or not variable resistance element 100 applied with the voltage pulse satisfies the determination condition, namely whether or not a resistance value of variable resistance element 100 is higher than the first threshold resistance value (Step S203). Specifically, for example, the resistance value of variable resistance element 100 applied with the voltage pulse is read by pulse application device 130, and it is determined by use of the sense amplifier as to whether or not the resistance value is higher than the first threshold resistance value. When the determination result is NO, data-write in variable resistance nonvolatile memory device 140 is completed (End).

When the determination result of Step S203 is YES, it is determined whether or not the number of times of verify write operations exceeds a first threshold number of times (Step S204). The first threshold number of times may be 1 or a predetermined natural number not smaller than 2.

The number of times of verify write operations may, for example, be the number of voltage pulses applied to the same variable resistance element after the start of data-write, or the number of times of YES in the determination of Step S203. The number of times of verify write operations may, for example, be stored in the data latch or the like provided in variable resistance nonvolatile memory device 140.

When the determination result of Step S204 is NO, the processing returns to Step S201.

When the determination result of Step S204 is YES, 1 is substituted for the LRv flag (Step S205), and the processing then returns to Step S201.

When a value of the LRv flag is 1 in Step S201 (YES in S201), the first voltage pulse is applied to variable resistance element 100 to be the targets for write operations (Step S206).

Next, it is determined whether or not variable resistance element 100 applied with the voltage pulse satisfies the determination condition, namely whether or not a resistance value of variable resistance element 100 is higher than the second threshold resistance value (Step S207). The second threshold resistance value is higher than the first threshold resistance value. That is, in the case of changing variable resistance element 100 from the high-resistance state to the low-resistance state as in the present embodiment, the determination result is more apt to be YES when a higher threshold resistance value is used for determination. It can thus be said that the determination condition using the relatively high second threshold resistance value has been more relaxed than the determination condition using the relatively low first threshold resistance value. Specifically, for example, the resistance value of variable resistance element 100 applied with the voltage pulse is read by pulse application device 130, and a magnitude correlation with the second threshold resistance value is determined by use of the sense amplifier. When the determination result is NO, data-write in variable resistance nonvolatile memory device 140 is completed (End).

When the determination result of Step S207 is YES, the processing returns to Step S201. That is, the first voltage pulse is repeatedly applied to variable resistance element 100 until the determination result of Step S207 becomes NO.

It is to be noted that the first voltage pulse that is applied in Step S202 and the first voltage pulse that is applied in Step S206 may be the same or may be different. Specifically, for example, voltages of those may be the same or may be different. Alternatively, for example, pulse widths of those may be the same or may be different. Each first voltage pulse may be a single pulse, or made up of a plurality of pulses.

In such an operation method, after the number of times of verify write operations exceeds the first threshold number of times, determination is executed using the relaxed determination condition of "whether or not the resistance value is higher than the second threshold resistance value". For this reason, the verify write operation is completed early, thereby to improve a write speed.

Also in the first reference mode, a similar modification to that in the first embodiment can be made.

(Second Reference Mode)

The following second reference mode is to relax the determination condition in accordance with the number of times of verify write operations in the case of performing write for changing one variable resistance element to the high-resistance state.

A write method for a variable resistance nonvolatile memory device of the second reference mode is the write method for the variable resistance nonvolatile memory device of the first embodiment, wherein a threshold resistance value which is lower than a third threshold resistance value is taken as a fourth threshold resistance value, the verify write operation is to read a resistance value of the variable resistance element after application of the second voltage pulse, and again apply the second voltage pulse to the variable resistance element whose read resistance value has been determined to be lower than the third threshold resistance value, and in the verify write operation, in a case where the number of times of verify write operations, having already been performed on one variable resistance element which is a target for write operations, exceeds a second threshold number of times, when the resistance value of the variable resistance element after application of the second voltage pulse is lower than the fourth threshold resistance value, the second voltage pulse is newly applied to the variable resistance element.

In other words, the write method for the variable resistance nonvolatile memory device of the second reference mode is the write method for the variable resistance nonvolatile memory device of the first embodiment, wherein a threshold resistance value which is lower than a third threshold resistance value is taken as a fourth threshold resistance value, the verify write operation is to read a resistance value of the variable resistance element after application of the second voltage pulse, and again apply the second voltage pulse to the variable resistance element whose read resistance value has been determined to be lower than the third threshold resistance value, and in the verify write operation, in a case where the number of times of verify write operations, having already been performed on one variable resistance element which is a target for write operations, exceeds a second threshold number of times, unless the resistance value of the variable resistance element after application of the second voltage pulse is lower than the fourth threshold resistance value, the second voltage pulse is not applied to the variable resistance element.

The variable resistance nonvolatile memory device of the second reference mode is the variable resistance nonvolatile memory device of the first embodiment, and the pulse application device executes the above write method.

[Device Configuration]

A configuration of the variable resistance nonvolatile memory device of the second reference mode can be made similar to that of the variable resistance nonvolatile memory device of the first embodiment except for the operation of the pulse application device (the operation method for the variable resistance nonvolatile memory device). Hence, a constituent which is common between the first embodiment and the second reference mode is provided with the same reference numeral and name, and a detailed description thereof is omitted.

[Method for Writing (Method for Operating for Variable Resistance Nonvolatile Memory Device)]

Figure 5:
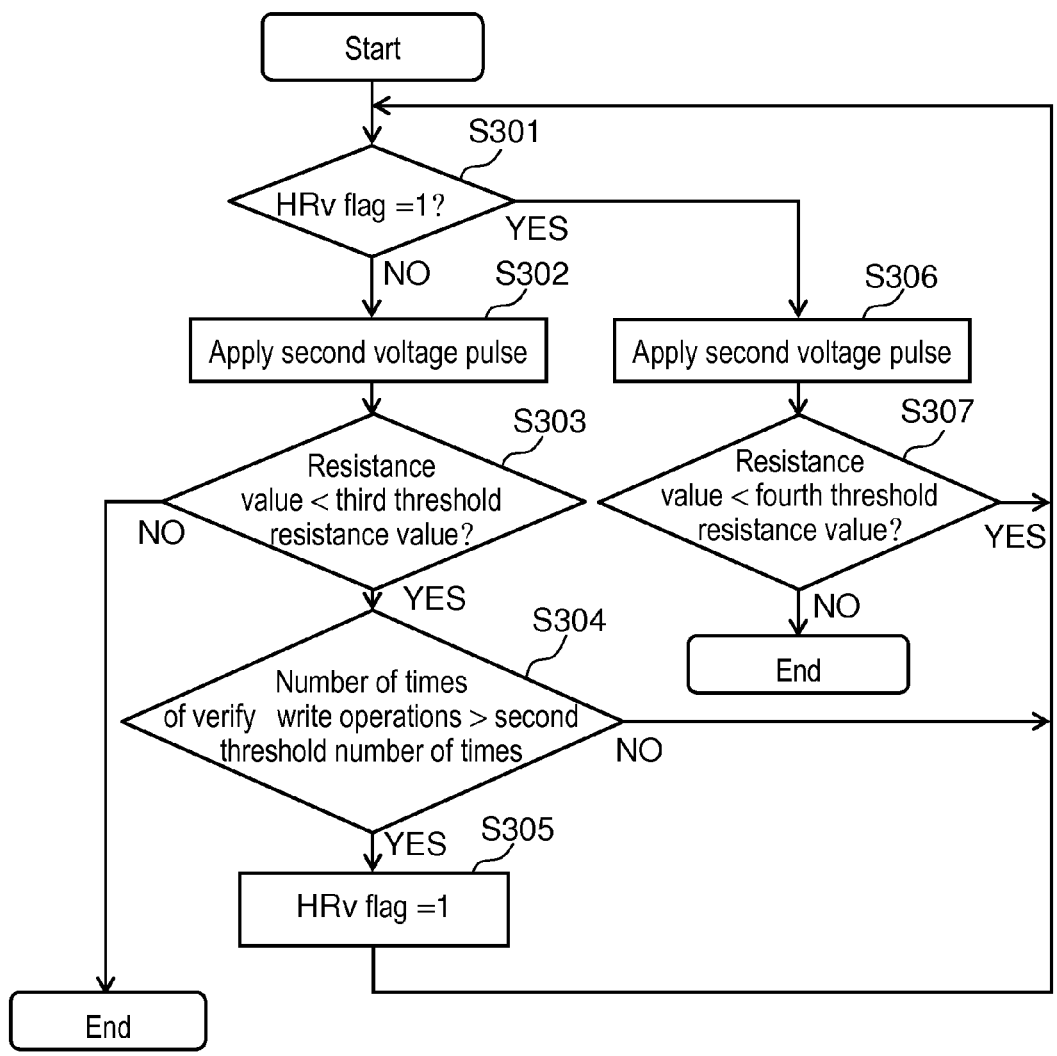
FIG. 5 is a flowchart showing one example of a method for writing into a variable resistance nonvolatile memory device according to a second reference mode.

FIG. 5 is a flowchart showing one example of the method for writing for the variable resistance nonvolatile memory device according to the second reference mode. An operation shown in FIG. 5 can be executed by control of pulse application device 130.

When data-write in variable resistance nonvolatile memory device 140 is started (Start), first, a value of a HRv flag indicating whether or not to relax the determination condition is checked (Step S301). The HRv flag is 0 in an initial state.

When a value of the HRv flag is 0 (NO in S301), the second voltage pulse is applied to variable resistance element 100 to be the targets for write operations (Step S302).

Next, it is determined whether or not variable resistance element 100 applied with the voltage pulse satisfies the determination condition, namely whether or not a resistance value of variable resistance element 100 is lower than the third threshold resistance value (Step S303). Specifically, for example, the resistance value of variable resistance element 100 applied with the voltage pulse is read by pulse application device 130, and it is determined by use of the sense amplifier as to whether or not the resistance value is lower than the third threshold resistance value. When the determination result is NO, data-write in variable resistance nonvolatile memory device 140 is completed (End).

When the determination result of Step S303 is YES, it is determined whether or not the number of times of verify write operations exceeds a second threshold number of times (Step S304). The second threshold number of times may be 1 or a predetermined natural number not smaller than 2.

The number of times of verify write operations may, for example, be the number of voltage pulses applied to the same variable resistance element after the start of data-write, or the number of times of YES in the determination of Step S303. The number of times of verify write operations may, for example, be stored in a data latch or the like provided in variable resistance nonvolatile memory device 140.

When the determination result of Step S304 is NO, the processing returns to Step S301.

When the determination result of Step S304 is YES, 1 is substituted for the HRv flag (Step S305), and the processing then returns to Step S301.

When a value of the HRv flag is 1 in Step S301 (YES in S301), the second voltage pulse is applied to variable resistance element 100 to be the targets for write operations (Step S306).

Next, it is determined whether or not variable resistance element 100 applied with the voltage pulse satisfies the determination condition, namely whether or not a resistance value of variable resistance element 100 is lower than the fourth threshold resistance value (Step S307). The fourth threshold resistance value is lower than the third threshold resistance value. That is, in the case of changing variable resistance element 100 from the low-resistance state to the high-resistance state as in the present embodiment, the determination result is more apt to be YES when a lower threshold resistance value is used for determination. It can thus be said that the determination condition using the relatively low fourth threshold resistance value has been more relaxed than the determination condition using the relatively high third threshold resistance value. Specifically, for example, the resistance value of variable resistance element 100 applied with the voltage pulse is read by pulse application device 130, and a magnitude correlation with the fourth threshold resistance value is determined by use of the sense amplifier. When the determination result is NO, data-write in variable resistance nonvolatile memory device 140 is completed (End).

When the determination result of Step S307 is YES, the processing returns to Step S301. That is, the first voltage pulse is repeatedly applied to variable resistance element 100 until the determination result of Step S307 becomes NO.

It is to be noted that the second voltage pulse that is applied in Step S302 and the second voltage pulse that is applied in Step S306 may be the same or may be different. Specifically, for example, voltages of those may be the same or may be different. Alternatively, for example, pulse widths of those may be the same or may be different. Each second voltage pulse may be a single pulse, or made up of a plurality of pulses.

In such an operation method, after the number of times of verify write operations exceeds the second threshold number of times, determination is executed using the relaxed determination condition of "whether or not the resistance value is lower than the fourth threshold resistance value". For this reason, the verify write operation is completed early, thereby to improve a write speed.

Also in the second reference mode, a similar modification to that in the first embodiment can be made.

The second reference mode may be combined with the first reference mode. In this case, the first threshold number of times and the second threshold number of times may be equal or may not be equal.

Second Exemplary Embodiment

A second embodiment is to relax the determination condition in accordance with an average number of times of verify write operations in the case of performing write for changing a plurality of variable resistance elements to the low-resistance state.

A method for writing into a variable resistance nonvolatile memory device of the second embodiment is the method for writing into the variable resistance nonvolatile memory device of the first embodiment, wherein a threshold resistance value which is higher than a first threshold resistance value is taken as a second threshold resistance value, the verify write operation is to read a resistance value of the variable resistance element after application of the first voltage pulse, and again apply the first voltage pulse to the variable resistance element whose read resistance value has been determined to be higher than the first threshold resistance value, and in the verify write operation, in a case where an average number of times of verify write operations, having already been performed on all or part of a plurality of variable resistance elements that are targets for write operations, exceeds a first threshold number of times, when the resistance value of the variable resistance element after application of the first voltage pulse is higher than the second threshold resistance value, the first voltage pulse is newly applied to the variable resistance element.

In other words, the write method for the variable resistance nonvolatile memory device of the second embodiment is the write method for the variable resistance nonvolatile memory device of the first embodiment, wherein a threshold resistance value which is higher than a first threshold resistance value is taken as a second threshold resistance value, the verify write operation is to read a resistance value of the variable resistance element after application of the first voltage pulse, and again apply the first voltage pulse to the variable resistance element whose read resistance value has been determined to be higher than the first threshold resistance value, and in the verify write operation, in a case where an average number of times of verify write operations, having already been performed on all or part of a plurality of variable resistance elements that are targets for write operations, exceeds a first threshold number of times, unless the resistance value of the variable resistance element after application of the first voltage pulse is higher than the second threshold resistance value, the first voltage pulse is not applied to the variable resistance element.

The variable resistance nonvolatile memory device of the second embodiment is the variable resistance nonvolatile memory device of the first embodiment, and the pulse application device executes the above write method.

[Device Configuration]

A configuration of the variable resistance nonvolatile memory device of the second embodiment can be made similar to that of the variable resistance nonvolatile memory device of the first embodiment except for the operation of the pulse application device (the operation method for the variable resistance nonvolatile memory device). Hence, a constituent which is common between the first embodiment and the second embodiment is provided with the same reference numeral and name, and a detailed description thereof is omitted.

[Method for Writing (Method for Operating for Variable Resistance Nonvolatile Memory Device)]

Figure 6:
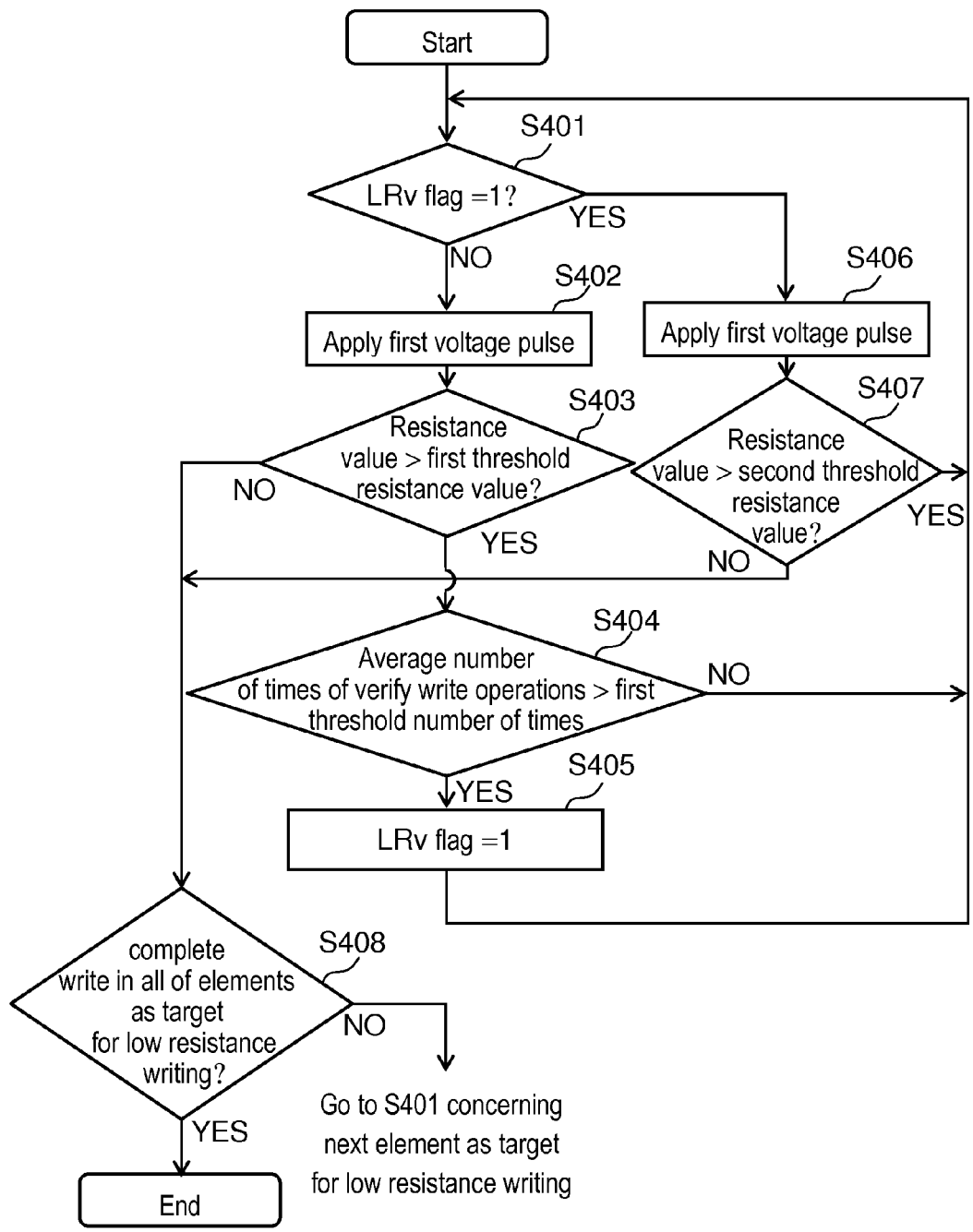
FIG. 6 is a flowchart showing one example of a method for writing into a variable resistance nonvolatile memory device according to a second embodiment.

FIG. 6 is a flowchart showing one example of the method for writing for the variable resistance nonvolatile memory device according to the second embodiment. An operation shown in FIG. 6 can be executed by control of pulse application device 130.

When data-write in variable resistance nonvolatile memory device 140 is started (Start), first, a value of a LRv flag indicating whether or not to relax the determination condition is checked (Step S401). The LRv flag is 0 in an initial state.

When a value of the LRv flag is 0 (NO in S401), the first voltage pulse is applied to variable resistance element 100 to be the targets for write operations (Step S402).

Next, it is determined whether or not variable resistance element 100 applied with the voltage pulse satisfies the determination condition, namely whether or not a resistance value of variable resistance element 100 is higher than the first threshold resistance value (Step S403). Specifically, for example, the resistance value of variable resistance element 100 applied with the voltage pulse is read by pulse application device 130, and it is determined by use of the sense amplifier as to whether or not the resistance value is higher than the first threshold resistance value. When the determination result is NO, it is determined whether or not write in all of the elements as targets for the low resistance writing (LR-writing) has been completed (Step S408). When the determination result is NO, the processing proceeds to Step S401 concerning the next element as the targets for the low resistance writing. When the determination result is YES, data-write in variable resistance nonvolatile memory device 140 is completed (End).

When the determination result of Step S403 is YES, it is determined whether or not an average number of times of verify write operations exceeds a first threshold number of times (Step S404). The first threshold number of times can be set to 0.1 or the like, for example.

The average number of times of verify write operations may, for example, be a number obtained by dividing a sum of voltage pulses applied after the start of data-write by the number of variable resistance elements in which write has been completed, or may be a number obtained by dividing a sum of the number of times of YES in the determination of Step S403 by the number of variable resistance elements in which write has been completed. The sum of voltage pulses applied after the start of data-write, the sum of the number of times of YES in the determination of Step S403, the number of variable resistance elements in which write has been completed, and the like may, for example, be stored in the data latch or the like provided in variable resistance nonvolatile memory device 140.

When the determination result of Step S404 is NO, the processing returns to Step S401.

When the determination result of Step S404 is YES, 1 is substituted for the LRv flag (Step S405), and the processing then returns to Step S401.

When a value of the LRv flag is 1 in Step S401 (YES in S401), the first voltage pulse is applied to variable resistance element 100 to be the targets for write operations (Step S406).

Next, it is determined whether or not variable resistance element 100 applied with the voltage pulse satisfies the determination condition, namely whether or not a resistance value of variable resistance element 100 is higher than the second threshold resistance value (Step S407). Since the second threshold resistance value can be made similar to that in the first reference mode, a detailed description thereof is omitted. When the determination result is NO, it is determined whether or not write in all of the elements as targets for low resistance writing (LR writing) has been completed (Step S408). When the determination result is NO, the processing proceeds to Step S401 concerning the next element as the targets for low resistance writing. When the determination result is YES, data-write in variable resistance nonvolatile memory device 140 is completed (End).

When the determination result of Step S407 is YES, the processing returns to Step S401. That is, the first voltage pulse is repeatedly applied to variable resistance element 100 until the determination result of Step S407 becomes NO.

It is to be noted that the first voltage pulse that is applied in Step S402 and the first voltage pulse that is applied in Step S406 may be the same or may be different. Specifically, for example, voltages of those may be the same or may be different. Alternatively, for example, pulse widths of those may be the same or may be different. Each first voltage pulse may be a single pulse, or made up of a plurality of pulses.

In such an operation method, after the number of times of verify write operations exceeds the first threshold number of times, determination is executed using the relaxed determination condition of "whether or not the resistance value is higher than the second threshold resistance value". For this reason, the verify write operation is completed early, thereby to improve a write speed.

Also in the second embodiment, a similar modification to that in the first embodiment can be made.

Further, the second embodiment may be combined with one or both of the first reference mode or the second reference mode.

Third Exemplary Embodiment

A third embodiment is to relax the determination condition in accordance with an average number of times of verify write operations in the case of performing write for changing a plurality of variable resistance elements to the high-resistance state.

A method for writing into a variable resistance nonvolatile memory device of the third embodiment is the method for writing into the variable resistance nonvolatile memory device of the first embodiment, wherein a threshold resistance value which is lower than a third threshold resistance value is taken as a fourth threshold resistance value, the verify write operation is to read a resistance value of the variable resistance element after application of the second voltage pulse, and again apply the second voltage pulse to the variable resistance element whose read resistance value has been determined to be lower than the third threshold resistance value, and in the verify write operation, in a case where an average number of times of verify write operations, having already been performed on all or part of a plurality of variable resistance elements that are targets for write operations, exceeds a second threshold number of times, when the resistance value of the variable resistance element after application of the second voltage pulse is lower than the fourth threshold resistance value, the second voltage pulse is newly applied to the variable resistance element.

In other words, the write method for a variable resistance nonvolatile memory device of the third embodiment is the write method for the variable resistance nonvolatile memory device of the first embodiment, wherein a threshold resistance value which is lower than a third threshold resistance value is taken as a fourth threshold resistance value, the verify write operation is to read a resistance value of the variable resistance element after application of the second voltage pulse, and again apply the second voltage pulse to the variable resistance element whose read resistance value has been determined to be lower than the third threshold resistance value, and in the verify write operation, in a case where an average number of times of verify write operations, having already been performed on all or part of a plurality of variable resistance elements that are targets for write operations, exceeds a second threshold number of times, unless the resistance value of the variable resistance element after application of the second voltage pulse is lower than the fourth threshold resistance value, the second voltage pulse is not applied to the variable resistance element.

The variable resistance nonvolatile memory device of the third embodiment is the variable resistance nonvolatile memory device of the first embodiment, and the pulse application device executes the above write method.

[Device Configuration]

A configuration of the variable resistance nonvolatile memory device of the third embodiment can be made similar to that of the variable resistance nonvolatile memory device of the first embodiment except for the operation of the pulse application device (the operation method for the variable resistance nonvolatile memory device). Hence, a constituent which is common between the first embodiment and the third embodiment is provided with the same reference numeral and name, and a detailed description thereof is omitted.

[Method for Writing (Method for Operating for Variable Resistance Nonvolatile Memory Device)]

Figure 7:
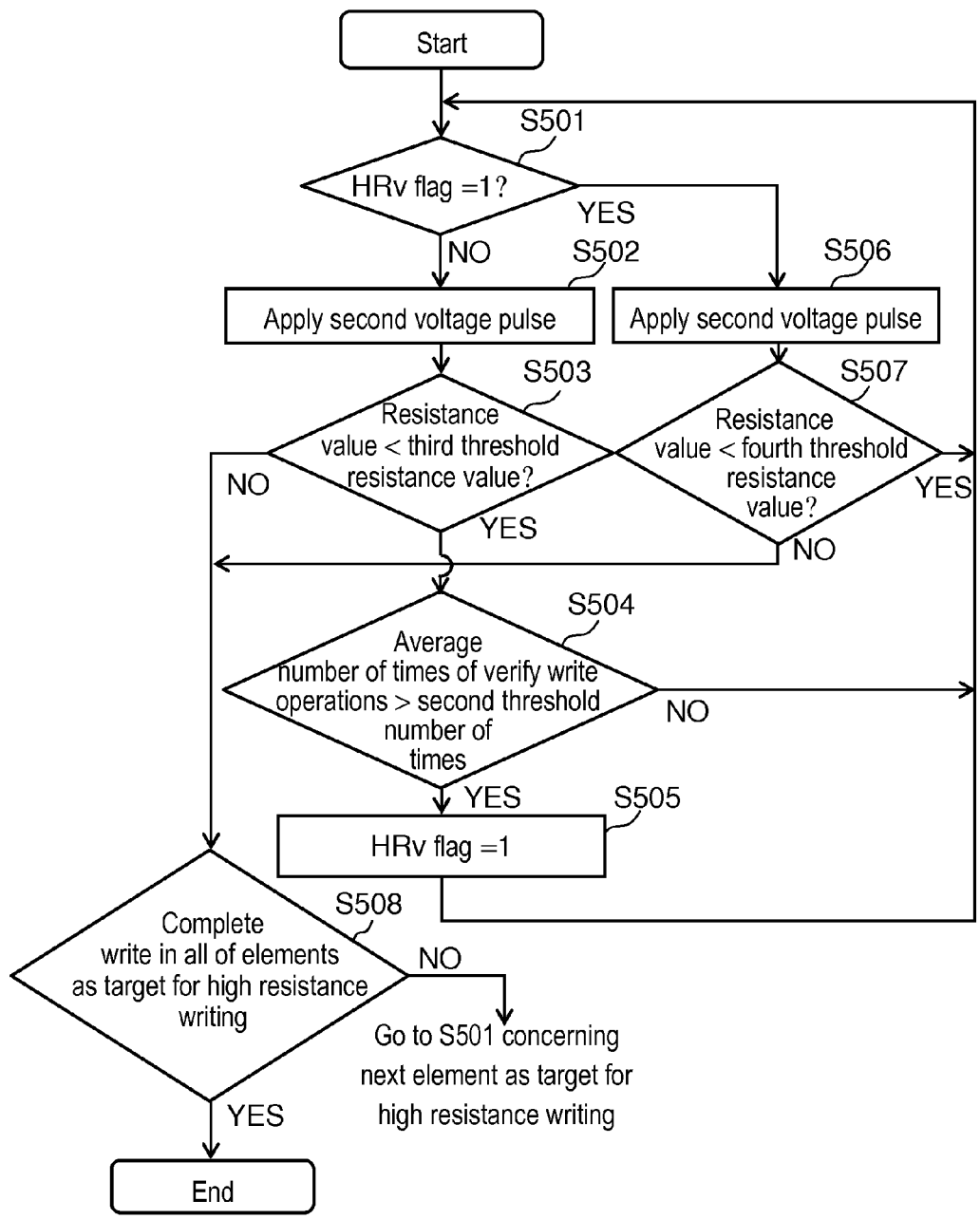
FIG. 7 is a flowchart showing one example of a method for writing into a variable resistance nonvolatile memory device according to a third embodiment.

FIG. 7 is a flowchart showing one example of the method for writing for the variable resistance nonvolatile memory device according to the third embodiment. An operation shown in FIG. 7 can be executed by control of pulse application device 130.

When data-write in variable resistance nonvolatile memory device 140 is started (Start), first, a value of a HRv flag indicating whether or not to relax the determination condition is checked (Step S501). The HRv flag is 0 in an initial state.

When a value of the HRv flag is 0 (NO in S501), the second voltage pulse is applied to variable resistance element 100 to be the targets for write operations (Step S502).

Next, it is determined whether or not variable resistance element 100 applied with the voltage pulse satisfies the determination condition, namely whether or not a resistance value of variable resistance element 100 is lower than the third threshold resistance value (Step S503). Specifically, for example, the resistance value of variable resistance element 100 applied with the voltage pulse is read by pulse application device 130, and it is determined by use of the sense amplifier as to whether or not the resistance value is lower than the third threshold resistance value. When the determination result is NO, it is determined whether or not write in all of the elements as targets for the high resistance writing (HR-writing) has been completed (Step S508). When the determination result is NO, the processing proceeds to Step S501 concerning the next element as the targets for the high resistance writing. When the determination result is YES, data-write in variable resistance nonvolatile memory device 140 is completed (End).

When the determination result of Step S503 is YES, it is determined whether or not an average number of times of verify write operations exceeds a second threshold number of times (Step S504). The second threshold number of times can be set to 0.1 or the like, for example.

The average number of times of verify write operations may, for example, be a number obtained by dividing a sum of voltage pulses applied after the start of data-write by the number of variable resistance elements in which write has been completed. The average number of times of verify write operations may be a number obtained by dividing a sum of the number of times of YES in the determination of Step S503 by the number of variable resistance elements in which write has been completed. The sum of voltage pulses applied after the start of data-write, a sum of the number of times of YES in the determination of Step S503, the number of variable resistance elements in which write has been completed, and the like may, for example, be stored in the data latch or the like provided in variable resistance nonvolatile memory device 140.

When the determination result of Step S504 is NO, the processing returns to Step S501.

When the determination result of Step S504 is YES, 1 is substituted for the HRv flag (Step S505), and the processing then returns to Step S501.

When a value of the HRv flag is 1 in Step S501 (YES in S501), the second voltage pulse is applied to variable resistance element 100 to be the targets for write operations (Step S506).

Next, it is determined whether or not variable resistance element 100 applied with the voltage pulse satisfies the determination condition, namely whether or not a resistance value of variable resistance element 100 is lower than the fourth threshold resistance value (Step S507). Since the fourth threshold resistance value can be made similar to that in the second reference mode, a detailed description thereof is omitted. When the determination result is NO, it is determined whether or not write in all of the elements as targets for high resistance writing has been completed (Step S508). When the determination result is NO, the processing proceeds to Step S501 concerning the next element as the targets for high resistance writing (HR writing). When the determination result is YES, data-write in variable resistance nonvolatile memory device 140 is completed (End).

When the determination result of Step S507 is YES, the processing returns to Step S501. That is, the first voltage pulse is repeatedly applied to variable resistance element 100 until the determination result of Step S507 becomes NO.

It is to be noted that the second voltage pulse that is applied in Step S502 and the second voltage pulse that is applied in Step S506 may be the same or may be different. Specifically, for example, voltages of those may be the same or may be different. Alternatively, for example, pulse widths of those may be the same or may be different. Each second voltage pulse may be a single pulse, or made up of a plurality of pulses.

In such an operation method, after the number of times of verify write operations exceeds the second threshold number of times, determination is executed using the relaxed determination condition of "whether or not the resistance value is lower than the fourth threshold resistance value". For this reason, the verify write operation is completed early, thereby to improve a write speed.

Also in the third embodiment, a similar modification to that in the first embodiment can be made.

Further, the third embodiment may be combined arbitrarily with the first reference mode, the second reference mode and the second embodiment.

(Third Reference Mode)

Figure 8:
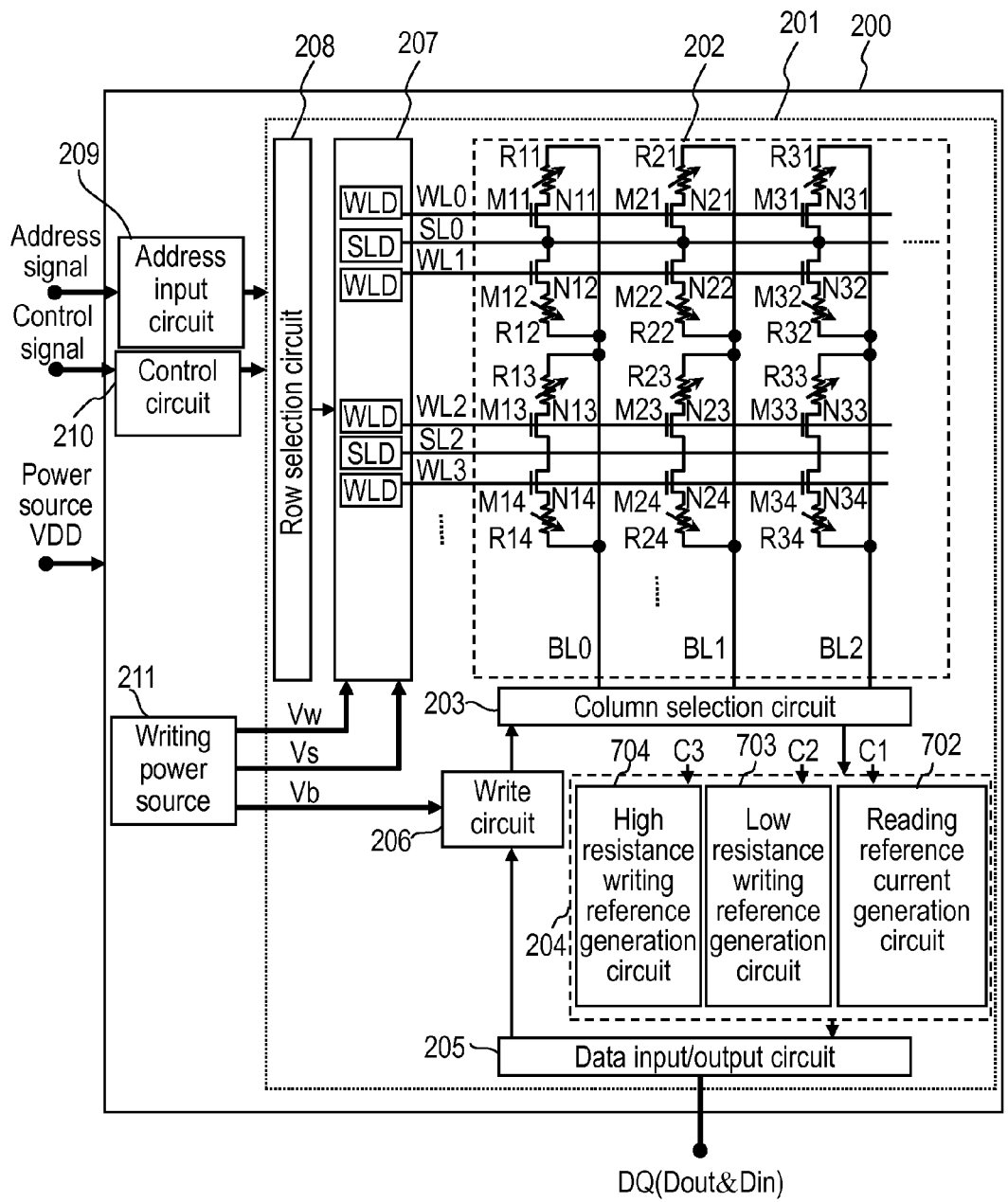
FIG. 8 is a block diagram showing a schematic configuration of a variable resistance nonvolatile memory device according to a third reference mode.

FIG. 8 is a block diagram showing a schematic configuration of a variable resistance nonvolatile memory device according to a third reference mode.

(1) Device Configuration

As shown in FIG. 8, variable resistance nonvolatile memory device 200 according to the third reference mode includes memory body part 201 on a semiconductor substrate, and memory body part 201 is provided with memory cell array 202 made up of 1T1R type memory cells having a similar configuration as in FIG. 2. Further, memory body part 201 is provided with: row selection circuit 208, row driver 207 provided with word line drivers WLD and source line drivers SLD; column selection circuit 203; and write circuit 206 for performing data-write. Moreover, it is provided with: sense amplifier 204 that detects an amount of a current flowing along a selected bit line, determines the high-resistance state as data "0", and determines the low-resistance state as data "1"; data input/output circuit 205 that performs input/output processing for input/output data via terminal DQ; and writing power source 211.

Variable resistance nonvolatile memory device 200 further includes: address input circuit 209 that receives an address signal inputted from the outside; and control circuit 210 that controls an operation of memory body part 201 based on a control signal inputted from the outside.

Memory cell array 202 is provided with a plurality of word lines WL0, WL1, WL2, WL3, . . . , and a plurality of bit lines BL0, BL1, BL2, . . . , which are formed on the semiconductor substrate and arrayed so as to intersect with each other. Memory cell array 202 is provided with: a plurality of NMOS transistors N11, N12, N13, N14, . . . , N21, N22, N23, N24, . . . , N31, N32, N33, N34, . . . , (hereinafter referred to as "transistors N11, N12, . . . "), which are respectively provided corresponding to intersections of word lines WL0, WL1, WL2, WL3, . . . , and bit lines BL0, BL1, BL2, . . . ; and a plurality of variable resistance elements R11, R12, R13, R14, . . . , R21, R22, R23, R24, . . . , R31, R32, R33, R34, . . . (hereinafter referred to as "variable resistance elements R11, R12, . . . ") which are connected in series, one to one, with transistors N11, N12, . . . . The structures where the individual NMOS transistors and the individual variable resistance elements, which are provided corresponding to the intersections of the plurality of bit lines and the plurality of word lines, are connected in series constitute memory cells M11, M12, M13, M14, . . . , M21, M22, M23, M24, . . . , M31, M32, M33, M34, . . . , (hereinafter referred to as "memory cells M11, M12, . . . ").

As shown in FIG. 8, gates of transistors N11, N21, N31, . . . are connected to word line WL0, and gates of transistors N12, N22, N32, . . . are connected to word line WL1. Further, gates of transistors N13, N23, N33, . . . are connected to word line WL2, and gates of transistors N14, N24, N34, . . . are connected to word line WL3.

Transistors N11, N21, N31, . . . and transistors N12, N22, N32, . . . are commonly connected to source line SL0, and transistors N13, N23, N33, . . . and transistors N14, N24, N34, . . . are commonly connected to source line SL2. That is, source lines SL0, SL2, . . . are arranged so as to be parallel to word lines WL0, WL1, WL2, WL3, . . . , and intersect (in a vertical direction in the present embodiment) with bit lines BL0, BL1, BL2, . . . .

It is to be noted that, although the source line is arranged in parallel with the word line in the above constitutional example, it may be arranged in parallel with the bit line. Further, although the configuration is formed where the source line gives a common potential to the transistor connected as a plate line, there may also be formed a configuration where a source line selection circuit with a similar configuration to that of row selection circuit 208 is provided and a selected source line and a non-selected source line are driven with different voltages (including polarities).

Variable resistance elements R11, R12, R13, R14, . . . are connected to bit line BL0, and variable resistance elements R21, R22, R23, R24, . . . are connected to bit line BL1. Further, variable resistance elements R31, R32, R33, R34, . . . are connected to bit line BL2. As thus described, memory cell array 202 in the embodiment has the configuration where variable resistance elements R11, R21, R31, . . . are directly connected to corresponding bit lines BL0, BL1, BL2, . . . without NMOS transistors N11, N21, N31, . . . .

In a data-write cycle, control circuit 210 outputs to write circuit 206 a write signal that directs application of a writing voltage in accordance with input data Din inputted into data input/output circuit 205. On the other hand, in a data-read cycle, control circuit 210 outputs to sense amplifier 204 a read signal that directs a read operation.

Row selection circuit 208 receives a row address signal outputted from address input circuit 209, and selects any of the plurality of word lines WL0, WL1, WL2, WL3, . . . via row driver 207 in accordance with this row address signal. Then, a predetermined voltage is applied from a word line driver circuit WLD, which corresponds to the selected word line, to the selected word line.

Similarly, row selection circuit 208 receives a row address signal outputted from address input circuit 209, and selects any of the plurality of source lines SL0, SL2, . . . in accordance with this row address signal. Then, a predetermined voltage is applied from a source line driver circuit SLD, which corresponds to the selected source line, to the selected source line.

When receiving a write signal (not shown) outputted from control circuit 210, write circuit 206 applies a writing voltage to a bit line selected by column selection circuit 203.

Writing power source 211 supplies row driver 207 with word-line voltage Vw and source-line voltage Vs, and supplies write circuit 206 with bit-line voltage Vb.

Figure 9:
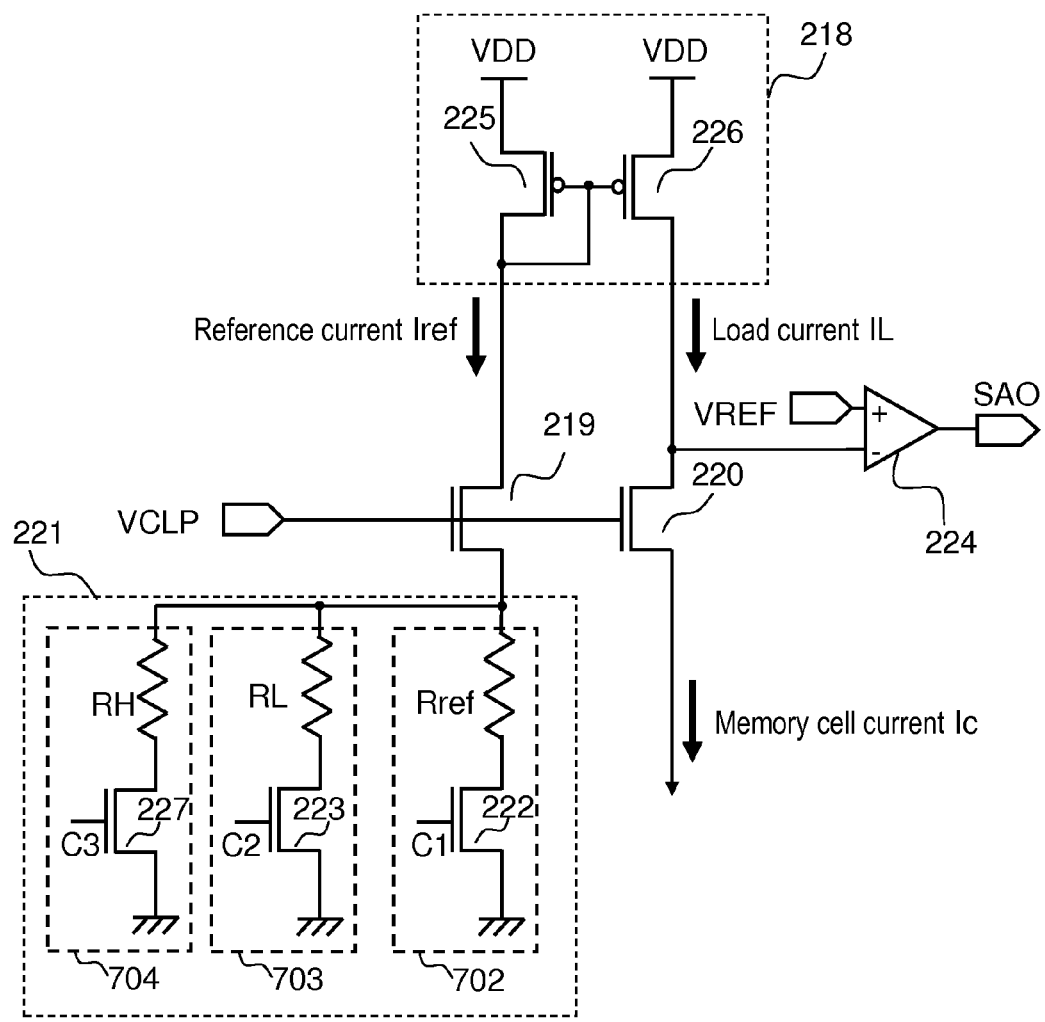
FIG. 9 is a circuit diagram showing one example of a schematic configuration of a sense amplifier provided in the variable resistance nonvolatile memory device according to the third reference mode.

FIG. 9 is a circuit diagram showing one example of a schematic configuration of the sense amplifier provided in the variable resistance nonvolatile memory device according to the third reference mode.

Sense amplifier 204 is, as one example, configured of current mirror circuit 218 with a mirror ratio of 1:1, clamp transistors 219, 220 having the same size, reference circuit 221, and differential amplifier 224. Reference circuit 221 is configured of reading reference current generation circuit 702, low resistance writing reference current generation circuit 703, and high resistance writing reference current generation circuit 704.

In reading reference current generation circuit 702, one end of a branch where selected transistor 222 is connected in series with reading reference resistor Rref is connected to the ground potential, and the other terminal is connected to a source terminal of clamp transistor 219. Further, read enable signal C1 is inputted into a gate terminal of selected transistor 222, and selected transistor 222 is switched by read enable signal C1 between a conduction state and a non-conduction state.

Similarly, in low resistance writing reference current generation circuit 703, one end of a branch where selected transistor 223 is connected in series with low-resistance verifying reference resistor RL (RL<Rref) is connected to the ground potential, and the other terminal is connected to the source terminal of clamp transistor 219. Further, low-resistance verify enable signal C2 is inputted into a gate terminal of selected transistor 223, and selected transistor 223 is switched by low-resistance verify enable signal C2 between the conduction state and the non-conduction state.

Similarly, in high resistance writing reference current generation circuit 704, one end of a branch where selected transistor 227 is connected in series with high-resistance verifying reference resistor RH (RH>Rref) is connected to the ground potential, and the other terminal is connected to the source terminal of clamp transistor 219. Further, high-resistance verify enable signal C3 is inputted into a gate terminal of selected transistor 227, and selected transistor 227 is switched by high-resistance verify enable signal C3 between the conduction state and the non-conduction state.

Clamp voltage VCLP (VCLP<VDD) is inputted into a gate terminal of each of clamp transistors 219, 220, and a source terminal of clamp transistor 220 is connected to the memory cell via column selection circuit 203 and the bit line. Drain terminals of clamp transistors (here, N-type MOS transistors) 219, 220 are respectively connected to drain terminals of transistors (here, P-type MOS transistors) 225, 226 constituting current mirror circuit 218. A drain terminal potential of clamp transistor 220 is compared with reference voltage VREF (1.1 V as one example) by differential amplifier 224, to determine whether it is higher or lower than reference voltage VREF, and the determination result is transmitted as sense amplifier output SAO to data input/output circuit 205.

Figure 10:
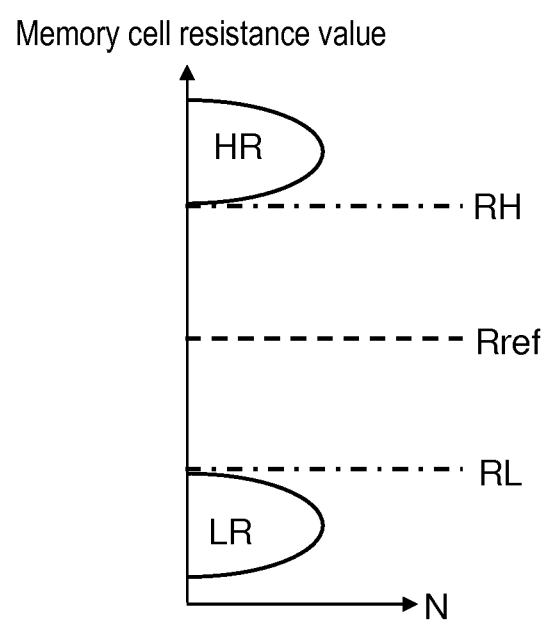
FIG. 10 is a schematic diagram showing a determination level of the sense amplifier in a method for writing into the variable resistance nonvolatile memory device according to the third reference mode.

FIG. 10 is a schematic diagram showing a determination level of the sense amplifier in a write method for the variable resistance nonvolatile memory device according to the third reference mode, and shows the relation between a resistance value (vertical axis) and a bit number (horizontal axis) at the time of performing write in a certain memory cell region.

As shown in FIG. 10, sense amplifier 204 has a determination level of reading reference resistor Rref between a resistance value of the memory cell being in the high-resistance state and a resistance value of the memory cell being in the low-resistance state. Further, sense amplifier 204 has a determination level of low-resistance verifying reference resistor RL which is lower than reading reference resistor Rref (RL<Rref), and a determination level of high-resistance verifying reference resistor RH which is higher than reading reference resistor Rref (Rref<RH).

Low-resistance verifying reference resistor RL is used for determining whether or not low-resistance write in the variable resistance element has been completed. High-resistance verifying reference resistor RH is used for determining whether or not high-resistance write in the variable resistance element has been completed. Reading reference resistor Rref is used for determining whether the variable resistance element is in the high-resistance state or the low-resistance state.

(2) Operation

Hereinafter, an operation of a main circuit block as to the variable resistance nonvolatile memory device configured as above will be described, and thereafter a read operation and a write operation of the variable resistance nonvolatile memory device will be described.

First, an operation of sense amplifier 204 shown in FIG. 9 will be described. In a low-resistance write process for lowering the resistance of the variable resistance element, after application of low resistance writing voltage pulse set 14 (see FIG. 11B) from write circuit 206, sense amplifier 204 is connected with an object memory cell via column selection circuit 203 and the bit line. At this time, the memory cell is configured not to be applied with a voltage larger than a voltage (VCLP−Vth) decreased from clamp voltage VCLP by an amount of a threshold voltage (Vth) of clamp transistors 219, 220.

On the other hand, in reference circuit 221, selected transistor 223 is activated by low-resistance verify enable signal C2, to come into the conduction state, and low resistance writing reference resistor RL is selected. Other selected transistors 222, 227 are deactivated by read enable signal C1 and high-resistance verify enable signal C3, to come into the non-conduction state, and reference current Iref (≈(VCLP−Vth)/RL) flows.

Hence, reference current Iref is transferred by current mirror circuit 218, a current which is almost the same as Iref flows as load current IL (IL=Iref), and magnitudes of this load current IL and memory cell current Ic are compared by clamp transistor 220. Depending on the comparison result, differential amplifier 224 detects whether a drain terminal voltage of clamp transistor 220 is higher or lower than reference voltage VREF (1.1 V as one example), and differential amplifier 224 outputs sense amplifier output SAO.

Here, when the resistance value of the variable resistance element after application of low resistance writing voltage pulse set 14 is referred to as RLt, memory cell current Ic (=(VCLP−Vth)/RLt) flows. At this time, when load current IL is higher than memory cell current Ic, the drain terminal voltage of clamp transistor 220 becomes higher than reference voltage VREF after predetermined time, and sense amplifier output SAO of a low level is made. That is, when the selected memory cell is in a resistance state which is higher than low resistance writing reference resistor RL, sense amplifier 204 indicates "0", and at this time, it is determined as failure (Fail) (verify Fail).

On the other hand, when load current IL is lower than or equal to memory cell current Ic, the drain terminal voltage of clamp transistor 220 becomes reference voltage VREF or lower after predetermined time, and sense amplifier output SAO of a high level is made. That is, when the selected memory cell is in a resistance state which is the same as or lower than low-resistance verifying reference resistor RL, sense amplifier 204 indicates "1", and at this time, it is determined as "Pass", showing that low-resistance write in the object memory cell has been completed.

Similarly, in a high-resistance write process, after application of high resistance writing voltage pulse set 13 (see FIG. 11A) from write circuit 206, sense amplifier 204 is connected with the object memory cell via column selection circuit 203 and the bit line. At this time, the memory cell is configured not to be applied with a voltage larger than a voltage (VCLP−Vth) decreased from clamp voltage VCLP by an amount of a threshold voltage (Vth) of clamp transistors 219, 220.

On the other hand, in reference circuit 221, selected transistor 227 is activated by high-resistance verify enable signal C3, to come into the conduction state, and high resistance writing reference resistor RH is selected. Other selected transistors 222, 223 are deactivated by read enable signal C1 and low-resistance verify enable signal C2, to come into the non-conduction state, and reference current Iref (≈(VCLP−Vth)/RH) flows.

Hence, reference current Iref is transferred by current mirror circuit 218, a current which is almost the same as Iref flows as load current IL (IL=Iref), and magnitudes of this load current IL and memory cell current Ic are compared by clamp transistor 220.

Here, when the resistance value of the variable resistance element after application of high resistance writing voltage pulse set 13 is referred to as RHt, memory cell current Ic (=(VCLP−Vth)/RHt) flows. At this time, when load current IL is lower than or equal to memory cell current Ic, the drain terminal voltage of clamp transistor 220 becomes reference voltage VREF or lower after predetermined time, and sense amplifier output SAO of a high level is made. That is, when the selected memory cell is in a resistance state which is the same as or lower than high resistance writing reference resistor RH, sense amplifier 204 indicates "1", and at this time, it is determined as "Fail" (verify Fail).

On the other hand, when load current IL is higher than memory cell current Ic, the drain terminal voltage of clamp transistor 220 becomes higher than reference voltage VREF after predetermined time, and sense amplifier output SAO of a low level is made. That is, when the selected memory cell is in a resistance state which is higher than high-resistance verifying reference resistor RH, sense amplifier 204 indicates "0", and at this time, it is determined as Pass, showing that high-resistance write in the object memory cell has been completed.

At the time of read, in reference circuit 221, selected transistor 222 is activated by read enable signal C1, to come into the conduction state, and reading reference resistor Rref is selected. Other selected transistors 223, 227 are deactivated by low resistance writing enable signal C2 and high resistance writing enable signal C3, to come into the non-conduction state, and reference current Iref (=(VCLP−Vth)/Rref) flows.

Hence, reference current Iref is transferred by current mirror circuit 218, a current which is almost the same as Iref flows as load current IL (IL=Iref), and magnitudes of this load current IL and memory cell current Ic are compared. Depending on the comparison result, it is detected as to whether the drain terminal voltage of clamp transistor 220 is higher or lower than reference voltage VREF, and differential amplifier 224 outputs sense amplifier output SAO.

Here, in a case where the resistance value of the memory cell in the high-resistance state is referred to as Rhr and the resistance value of the memory cell in the low-resistance state is referred to as Rlr (Rhr>Rref>Rlr), memory cell current Ic (=(VCLP−Vth)/Rhr) flows when the selected memory cell is in the high-resistance state. At this time, load current IL is higher than memory cell current Ic, the drain terminal voltage of clamp transistor 220 becomes higher than reference voltage VREF, and sense amplifier output SAO of a low level is made. That is, when the selected memory cell is in a high-resistance state (Rhr) which is higher than reading reference resistor Rref, sense amplifier 204 determines it as "0" data.

On the other hand, when the selected memory cell is in the low-resistance state, memory cell current Ic (=(VCLP−Vth)/Rlr) flows. At this time, when load current IL is lower than or equal to memory cell current Ic, the drain terminal voltage of clamp transistor 220 becomes reference voltage VREF or lower, and sense amplifier output SAO of a high level is made. That is, when the selected memory cell is in a low-resistance state (Rlr) which is the same as or lower than reading reference resistor Rref, sense amplifier 204 determines it as "1" data.

Figure 11A:
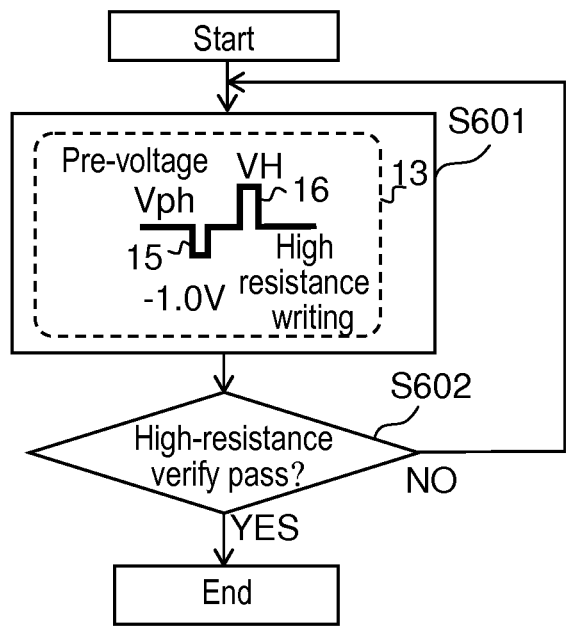
FIG. 11A is a schematic flowchart for explaining a verify write operation in the case of writing to high resistance state in the variable resistance nonvolatile memory device according to the third reference mode.

FIG. 11A is a schematic flowchart for explaining a verify write operation at the time of increasing resistance in the variable resistance nonvolatile memory device according to the third reference mode.

In the 1T1R type memory cell shown in FIG. 2, high resistance writing voltage pulse set 13 is applied (S601), and it is then determined as to whether or not a cell current of the write object cell has become lower than a predetermined high-resistance cell current level, namely whether or not high-resistance write has been completed (Pass in high-resistance verify) (S602).

Here, if the high-resistance verify determination (S602) is NO (verify Fail), high resistance writing voltage pulse set 13 is again applied to the write object cell (S601), to perform high-resistance verify determination (S602). This operation is hereafter repeated until the high-resistance verify determination (S602) becomes YES.

Here, as one example, high resistance writing voltage pulse set 13 is made up of two pulses: negative-voltage pre-voltage pulse 15 (pre-voltage Vph=−1.0 V, pulse width of 50 ns); and positive-voltage high resistance writing voltage pulse 16 (high resistance writing voltage VH, pulse width of 50 ns). In negative-voltage pre-voltage pulse 15, gate voltage VG=2.8 V is applied to gate terminal 103 of the memory cell shown in FIG. 2, a voltage of +1.0 V is applied to first electrode terminal 101, and the ground potential is applied to second electrode terminal 102. In positive-voltage high resistance writing voltage pulse 16, gate voltage VG=2.8 V is applied to gate terminal 103, a high resistance writing voltage VH (e.g., +1.8 V to +2.8 V) is applied to second electrode terminal 102, and the ground potential is applied to first electrode terminal 101.

Figure 11B:
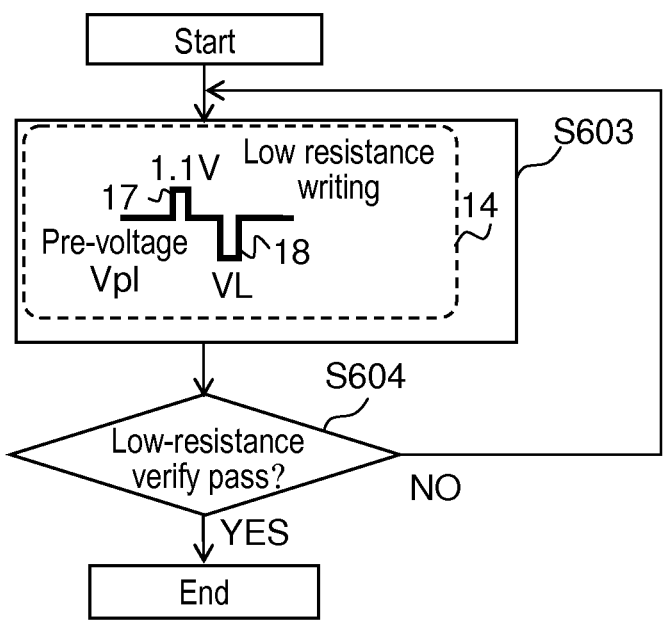
FIG. 11B is a schematic flowchart for explaining a verify write operation in the case of writing to low-resistance state in the variable resistance nonvolatile memory device according to the third reference mode.

FIG. 11B is a schematic flowchart for explaining a verify write operation at the time of lowering resistance in the variable resistance nonvolatile memory device according to the third reference mode.

In the 1T1R type memory cell shown in FIG. 2, low resistance writing voltage pulse set 14 is applied (S603), and it is then determined as to whether or not a cell current of the write object cell has become higher than a predetermined low-resistance cell current level, namely whether or not low-resistance write has been completed (Pass in low-resistance verify) (S604).

Here, if the low-resistance verify determination (S604) is NO (verify Fail), low resistance writing voltage pulse set 14 is again applied to the write object cell (S603), to perform low-resistance verify determination (S604). This operation is hereafter repeated until the low-resistance verify determination (S604) becomes YES.

Here, as one example, low resistance writing pulse set 14 is made up of two pulses: positive-voltage pre-voltage pulse 17 (pre-voltage Vpl=+1.1 V, pulse width of 50 ns); and negative-voltage low resistance writing voltage pulse 18 (low resistance writing voltage VL=−2.8 V, pulse width of 50 ns). In positive-voltage pre-voltage pulse 17, gate voltage VG=2.8 V is applied to gate terminal 103 of the memory cell shown in FIG. 2, a voltage of +1.1 V is applied to second electrode terminal 102, and the ground potential is applied to first electrode terminal 101. In negative-voltage low resistance writing voltage pulse 18, gate voltage VG=2.8 V is applied to gate terminal 103, a voltage of +2.8 V is applied to first electrode terminal 101, and the ground potential is applied to second electrode terminal 102.

FIG. 12 is a table showing a set voltage of each operation in the write method for the variable resistance nonvolatile memory device according to the third reference mode. With reference to FIG. 12, a description will be given below of voltage pulses which are applied to the memory cell at the time of low resistance writing, high resistance writing, and read operations; and voltages which are applied to the word line (WL), the source line (SL), and the bit line (BL) for applying the voltage pulses to the memory cell.

The voltages which are applied to the word line (WL), the source line (SL) and the bit line (BL) are generated in writing power source 211. Word-line voltage Vw is applied from word line driver circuit WLD to the word line, source-line voltage Vs is applied from source line driver circuit SLD to the source line, and bit-line voltage Vb is applied to the bit line via write circuit 206 and column selection circuit 203.

In FIG. 12, in low resistance writing, subsequently to application of the positive pulse (positive-voltage pre-voltage pulse 17 in FIG. 11B), the negative pulse (low resistance writing voltage pulse 18 in FIG. 11B) is applied. A bit line voltage at the time of application of positive-voltage pre-voltage pulse 17 is a voltage pulse with an amplitude of 1.1 V. A bit line voltage at the time of application of low resistance writing voltage pulse 18 is a voltage pulse with an amplitude of 2.8 V.

In FIG. 12, in high resistance writing, subsequently to application of the negative pulse (negative-voltage pre-voltage pulse 15 in FIG. 11A), the positive pulse (high resistance writing voltage pulse 16 in FIG. 11A) is applied. A bit line voltage at the time of application of negative-voltage pre-voltage pulse 15 is a voltage pulse with an amplitude of 1.0 V. A bit line voltage at the time of application of high resistance writing voltage pulse 16 is a voltage pulse with an amplitude of 2.2 V.

Bit line BL voltages Vread at the time of read, at the time of verify determination read of low resistance writing and at the time of verify determination read of high resistance writing are to be voltage values adjusted such that read disturbance does not occur (i.e., the resistance state of the variable resistance element remains unchanged). Further, VDD is a power supply voltage that is supplied to variable resistance nonvolatile memory device 200.

With reference to FIGS. 13A to 13C and FIG. 8, a description will be given of one example of each of the data-write cycle and the data-read cycle of the variable resistance nonvolatile memory device configured as above.

Figure 13A:
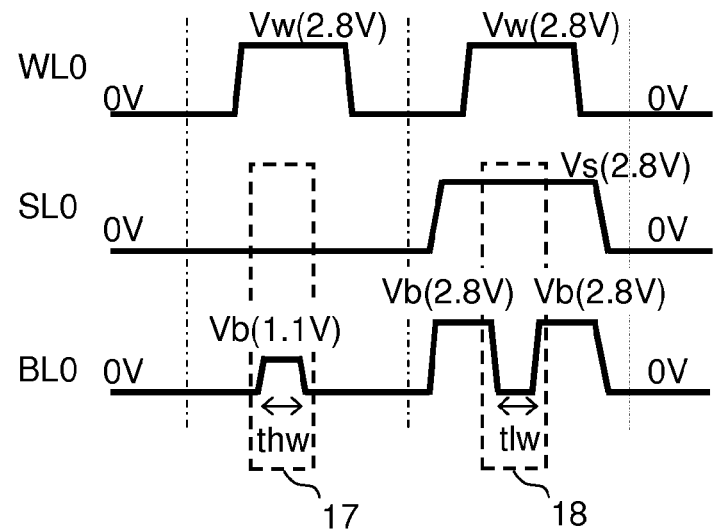
FIG. 13A is a timing chart showing a low-resistance write operation of the variable resistance nonvolatile memory device according to the third reference mode.
Figure 13B:
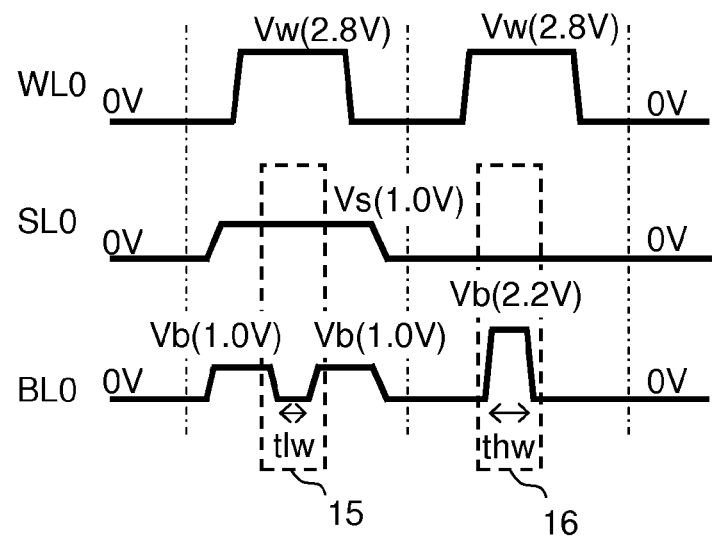
FIG. 13B is a timing chart showing a high resistance write operation of the variable resistance nonvolatile memory device according to the third reference mode.
Figure 13C:
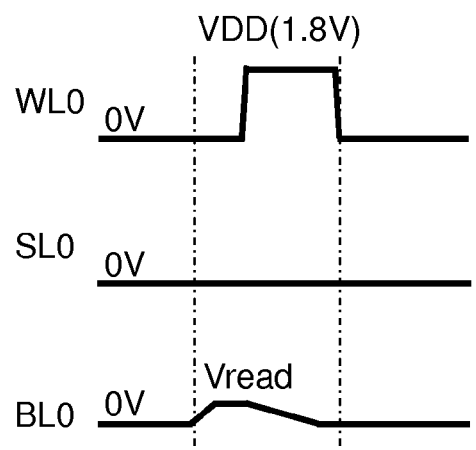
FIG. 13C is a timing chart showing a read operation of the variable resistance nonvolatile memory device according to the third reference mode.

FIGS. 13A, 13B and 13C are timing charts each showing the low resistance write operation, the high resistance read operation, and the read operation as to the variable resistance nonvolatile memory device according to the third reference mode. The following description will be given to the case of performing data-write and data-read on one memory cell (e.g., memory cell M11).

FIG. 13A shows a timing chart for application of low resistance writing voltage pulse set 14 (see FIG. 11B) in low-resistance write performed on memory cell M11. In application of low resistance writing voltage pulse set 14, positive-voltage pre-voltage pulse 17 and low resistance writing voltage pulse 18 are applied to memory cell M11.

In application cycle of positive-voltage pre-voltage pulse 17, first, selected bit line BL0 and source line SL0 are each set to a voltage of 0 V. Next, word line WL0 to be selected is set to voltage Vw (2.8 V), and NMOS transistor N11 of selected memory cell M11 of FIG. 8 is turned on.

Subsequently, selected bit line BL0 is set to voltage Vb (1.1 V) during time thw, followed by application of a pulse waveform that makes the voltage again be 0 V. At this stage, although a positive voltage pulse of weak high resistance writing voltage Vpl (+1.1 V) is applied to memory cell M11 of FIG. 8, the resistance value hardly changes and remains in the high-resistance state.

In subsequently implemented application cycle of low resistance writing voltage pulse 18, first, selected bit line BL0 and source line SL0 are each set to the voltage of 0 V. Next, selected bit line BL0 and source line SL0 are respectively set to voltage Vs (2.8 V) and voltage Vb (2.8 V). Next, word line WL0 to be selected is set to voltage Vw (2.8 V), but at this time, NMOS transistor N11 of selected memory cell M11 of FIG. 8 is still in an off-state. At this stage, a drain terminal and a source terminal of NMOS transistor N11 of FIG. 8 have the same potential, and a current does not flow therethrough regardless of on-and-off of the transistor.

Next, selected bit line BL0 is set to the voltage of 0 V during time tlw, followed by application of a pulse waveform that makes the voltage again be voltage Vb (2.8 V). At this stage, a negative voltage pulse of low resistance writing voltage VL (−2.8 V) is applied to memory cell M11 of FIG. 8, and the resistance value of memory cell M11 shifts from the high resistance value to the low resistance value. Thereafter, word line WL0 is set to the voltage of 0 V, to complete application of the low resistance writing voltage pulse. However, this method is not restrictive.

FIG. 13B shows a timing chart for application of high resistance writing voltage pulse set 13 (see FIG. 11A) in high-resistance write performed on memory cell M11. In application of high resistance writing voltage pulse set 13, negative-voltage pre-voltage pulse 15 and high resistance writing voltage pulse 16 are applied to memory cell M11.

In application cycle of negative-voltage pre-voltage pulse 15, first, selected bit line BL0 and source line SL0 are each set to the voltage of 0 V. Next, selected bit line BL0 is set to voltage Vb (1.0 V), and source line SL0 is set to Vs (1.0 V). Next, word line WL0 to be selected is set to voltage Vw (2.8 V), and NMOS transistor N11 of selected memory cell M11 of FIG. 8 is turned on.

Subsequently, selected bit line BL0 is set to the voltage of 0 V during time tlw, followed by application of a pulse waveform that makes the voltage again be voltage Vb (1.0 V). At this stage, although a negative voltage pulse of weak low resistance writing voltage Vph (−1.0 V) is applied to memory cell M11 of FIG. 8, the resistance value hardly changes and remains in the low-resistance state.

In subsequently implemented application cycle of high resistance writing voltage pulse 16, first, selected bit line BL0 and source line SL0 are each set to the voltage of 0 V. Next, word line WL0 to be selected is set to voltage Vw (2.8 V), but at this time, NMOS transistor N11 of selected memory cell M11 of FIG. 8 is still in an off-state. At this stage, a drain terminal and a source terminal of NMOS transistor N11 of FIG. 8 have the same potential, and a current does not flow therethrough regardless of on-and-off of the transistor.

Next, selected bit line BL0 is set to voltage Vb (2.2 V) during time thw, followed by application of a pulse waveform that makes the voltage again be 0 V. At this stage, a positive voltage pulse of high resistance writing voltage VH (+2.2 V) is applied to memory cell M11 of FIG. 8, and the resistance value of memory cell M11 shifts from the low resistance value to the high resistance value. Thereafter, word line WL0 is set to the voltage of 0 V, to complete application of the high resistance writing voltage pulse. However, this method is not restrictive. Only the application cycle of low resistance writing voltage pulse 18 and voltage Vb to be applied to the bit line are different, and the same circuit operation is performed. Although a specific description is thus omitted here, the resistance value of memory cell M11 shifts to a predetermined high-resistance value by application of the positive voltage pulse of high resistance writing voltage VH (+2.2 V) to memory cell M11 of FIG. 8 in the low-resistance state.

FIG. 13C shows a timing chart for a cycle of data-read performed on memory cell M11. In this read cycle, first, selected bit line BL0 and source line SL0 are each set to the voltage of 0 V. Next, bit line BL0 to be selected is precharged to read voltage Vread.

Subsequently, word line WL0 to be selected is set to voltage VDD (VDD>Vread), and NMOS transistor N11 of selected memory cell M11 is turned on while selected bit line BL0 is discharged. Thereafter, a value of a current that flows through selected memory cell M11 is detected by sense amplifier 204 after a predetermined period, to determine stored data as data "0" or data "1". Then, word line WL0 is set to the voltage of 0 V, to complete the data-read operation.

As for the read operation, reading reference resistor Rref is used in sense amplifier 204. The read method shown in FIG. 13C is similar between the time of low-resistance verify read and the time of high-resistance verify read except that low-resistance verifying reference resistor RL is used at the time of low-resistance verify read and high-resistance verifying reference resistor RH is used at the time of high-resistance verify read.

Figure 14:
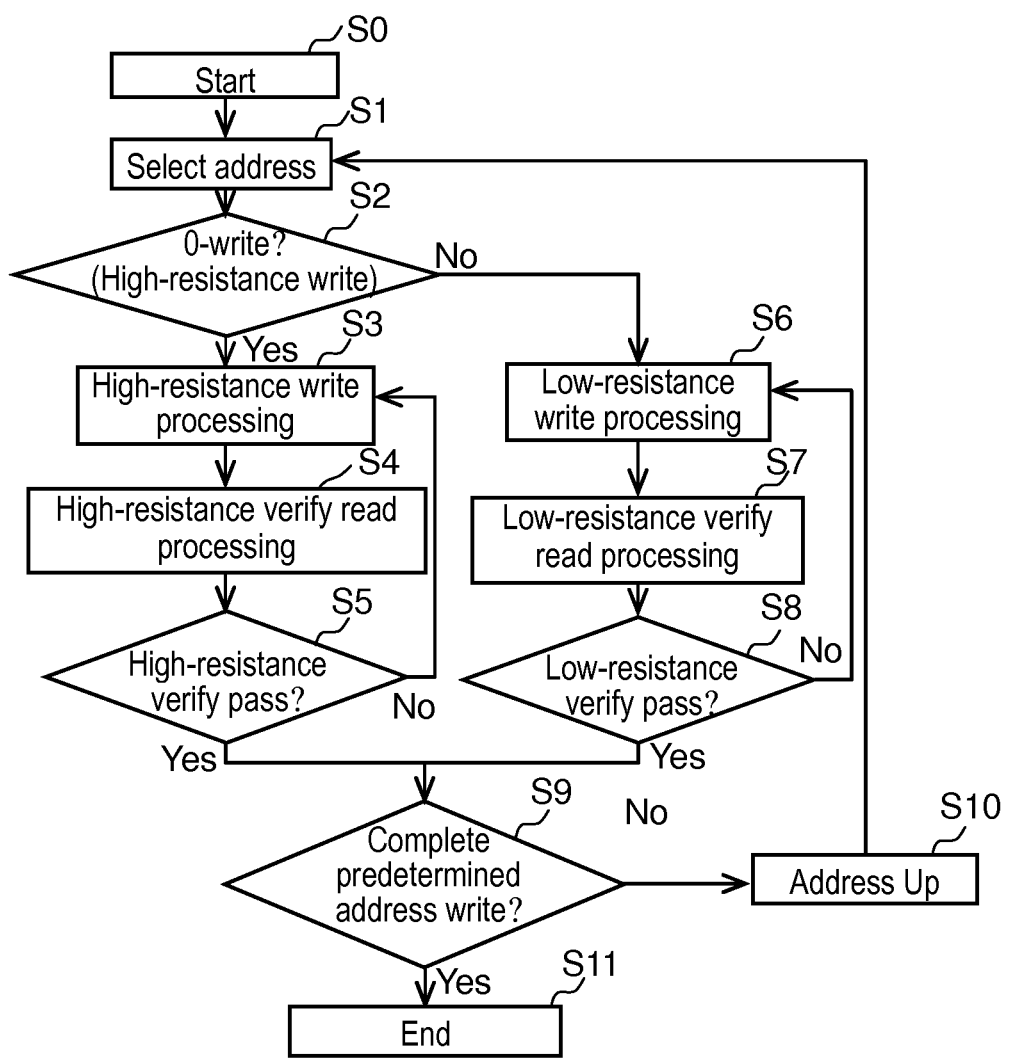
FIG. 14 is a flowchart showing the method for writing into the variable resistance nonvolatile memory device according to the third reference mode.

FIG. 14 is a flowchart showing the write method for the variable resistance nonvolatile memory device according to the third reference mode. With reference to FIG. 14, a description will be given below of one example of a write operation in the variable resistance nonvolatile memory device of the third reference mode.

In FIG. 14, when the flowchart is started (S0), a memory cell (e.g., M11 of FIG. 8) with an initial address of an address space where data is to be written is selected (S1). Then, in "0" data-write (high-resistance write) (Yes in S2), high-resistance write processing for applying high resistance writing voltage pulse set 13 is executed (S3), and in "1" data-write (low-resistance write) (No in S2), low-resistance write processing for applying low resistance writing voltage pulse set 14 is executed (S6).

Next, the selected memory cell is connected to sense amplifier 204, and high-resistance verify read processing or low-resistance verify read processing is performed (S4 or S7). In the case of high-resistance write, the high-resistance write processing (S3) is repeated until the resistance value of the memory cell becomes higher than high-resistance verifying reference resistor RH and the verify determination result becomes Pass (while the determination is No in S5). In the case of low-resistance write, the resistance value of the memory cell is lower than low-resistance verifying reference resistor RL, and the low-resistance write processing (S6) is repeated until the verify determination result becomes Pass (while the determination is No in S8). Being determined as No in S5 or S8 is "verify Fail".

In the case of Pass in the verify determination (Yes in S5 or S8), when there is a next address (No in S9), the processing shifts to write processing on the next address (S10), and when there is no next address (Yes in S9), the processing is completed (S11).

By such a flow, it is possible to perform write in a higher resistance state than high-resistance verifying reference resistor RH in high-resistance write, and perform write in a lower resistance state than low-resistance verifying reference resistor RL in low-resistance write, and it is thus possible to perform write while a predetermined operation window is ensured.

Here, Steps S4 and S7 correspond to the timing chart of FIG. 13C, Step S3 corresponds to the timing chart of FIG. 13B, and Step S6 corresponds to the timing chart of FIG. 13A.

(3) Conclusion

Next, a description will be given of a circuit operation result and its problem in the case of using the circuit configuration and the circuit operation of the third reference mode described above.

Here, as one example, a case is considered where, in the write flow of FIG. 14, a verify determination value of the high-resistance verify (S5) (=high-resistance verifying reference resistor RH in FIG. 10) is 40 kΩ, and a verify determination value of the low-resistance verify (S8) (=low-resistance verifying reference resistor RL) is 7.5 kΩ.

Figure 16:
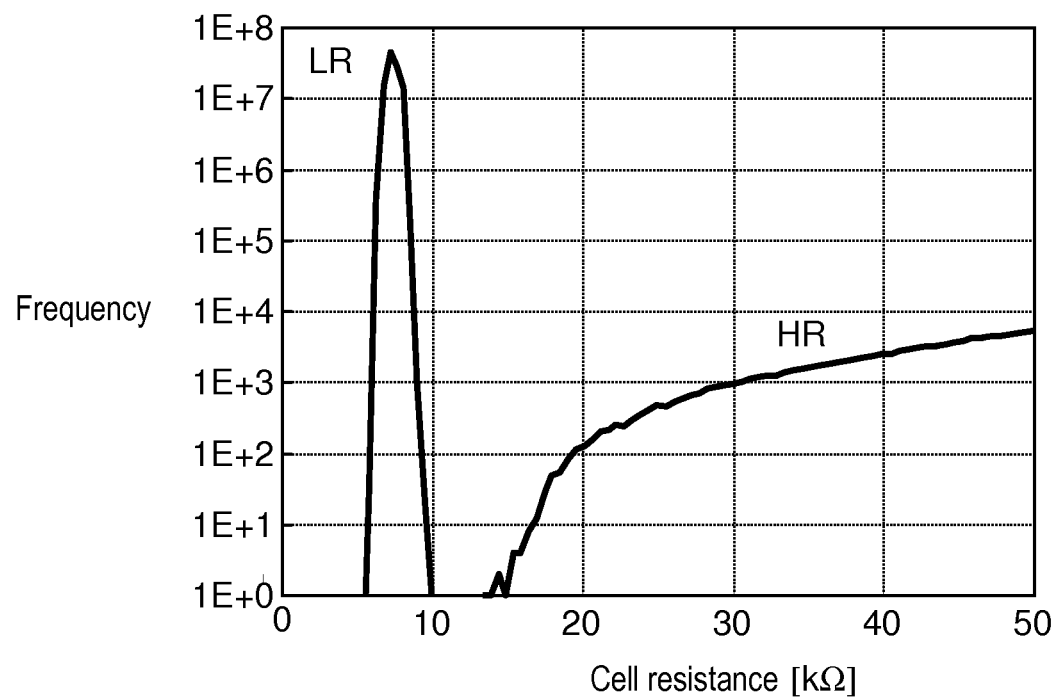
FIG. 16 is a diagram showing a resistance value frequency distribution in a case where high resistance writing and low resistance writing is repeated 50000 times while the verify operation is performed in the variable resistance nonvolatile memory device (1 k bits) according to the third reference mode.

FIGS. 15 and 16 are diagrams each showing a resistance value frequency distribution in a case where increasing and lowering resistance is repeated 50000 times in the variable resistance nonvolatile memory device (1 k bits). More specifically, FIGS. 15 and 16 show cell resistance frequency distributions (1 k bits×50000 times) immediately before and after the high-resistance verify (S5) and the low-resistance verify (S8) when an operation of performing overall low-resistance write in the 1 k-bit memory cell array after overall high-resistance write therein is repeated 50000 times. FIG. 15 is a diagram showing a resistance value frequency distribution in a case where increasing and lowering resistance is repeated 50000 times while the verify operation is not performed. FIG. 16 is a diagram showing a resistance value frequency distribution in a case where increasing and lowering resistance is repeated 50000 times while the verify operation is performed.

A circle in the drawing is a measurement limit. A cell with a resistance not lower than 17 kΩ is reduced and outputted as 17 kΩ in the distribution after low-resistance write, and a cell with a resistance not lower than 43 kΩ is reduced and outputted as 43 kΩ in the distribution after high-resistance write.

As seen from FIG. 15, before performing the verify operation, an upper limit of the cell current distribution after low-resistance write has been extended to not lower than 17 kΩ, and a lower limit of the cell current distribution after high-resistance write has been extended to 10.6 kΩ. That is, it can be verified that a gap (operation window) between the resistance value distribution of the element applied with the low resistance writing voltage pulse and the resistance value distribution of the element applied with the high resistance writing voltage pulse has not been able to be ensured.

FIG. 16 shows a cell resistance frequency distribution (1 k bits×50000 times) immediately after the high-resistance verify (S5) Pass and the low-resistance verify (S8) Pass after performing the verify operation. From FIG. 16, it can be verified that performing the verify operation leads to convergence of the low-resistance-side resistance value to not higher than 10 kΩ. Also on the high-resistance side, even the lowest resistance value bit (tail bit) is 14 kΩ although the resistance value distribution has extended over 40 kΩ due to fluctuations in resistance value after Pass of the verify operation. It is thus found that performing the verify operation has allowed the operation window to be ensured.

FIG. 17 shows a shift of an average number of times of Fail per bit in the low-resistance verify operation in the case of performing the same operation as above. The number of times of verify Fail is on the order of 0.05 time early in write, but it increases to the order of 0.4 time in the vicinity of 50000 times. That is, after 50000 times, verify Fail occurs 0.4 time per write on average, and hence 1.4 times of write operations in total is required, causing a problem of a decrease in write speed from a speed in designing by 40%.

Fourth Exemplary Embodiment

The present inventors found that the above problem can be solved by devising the circuit configuration and the circuit operation. A circuit configuration and operation concerning the fourth embodiment will be described below.

(1) Device Configuration

A variable resistance nonvolatile memory device of the fourth embodiment has been configured similarly to that in the third reference mode shown in FIG. 8 except for the configuration of the sense amplifier and the control operation by the control circuit. Hence, a configuration which is common between the present fourth embodiment and the third reference mode shown in FIG. 8 is provided with the same reference numeral and name, and a detailed description thereof is omitted.

Figure 18:
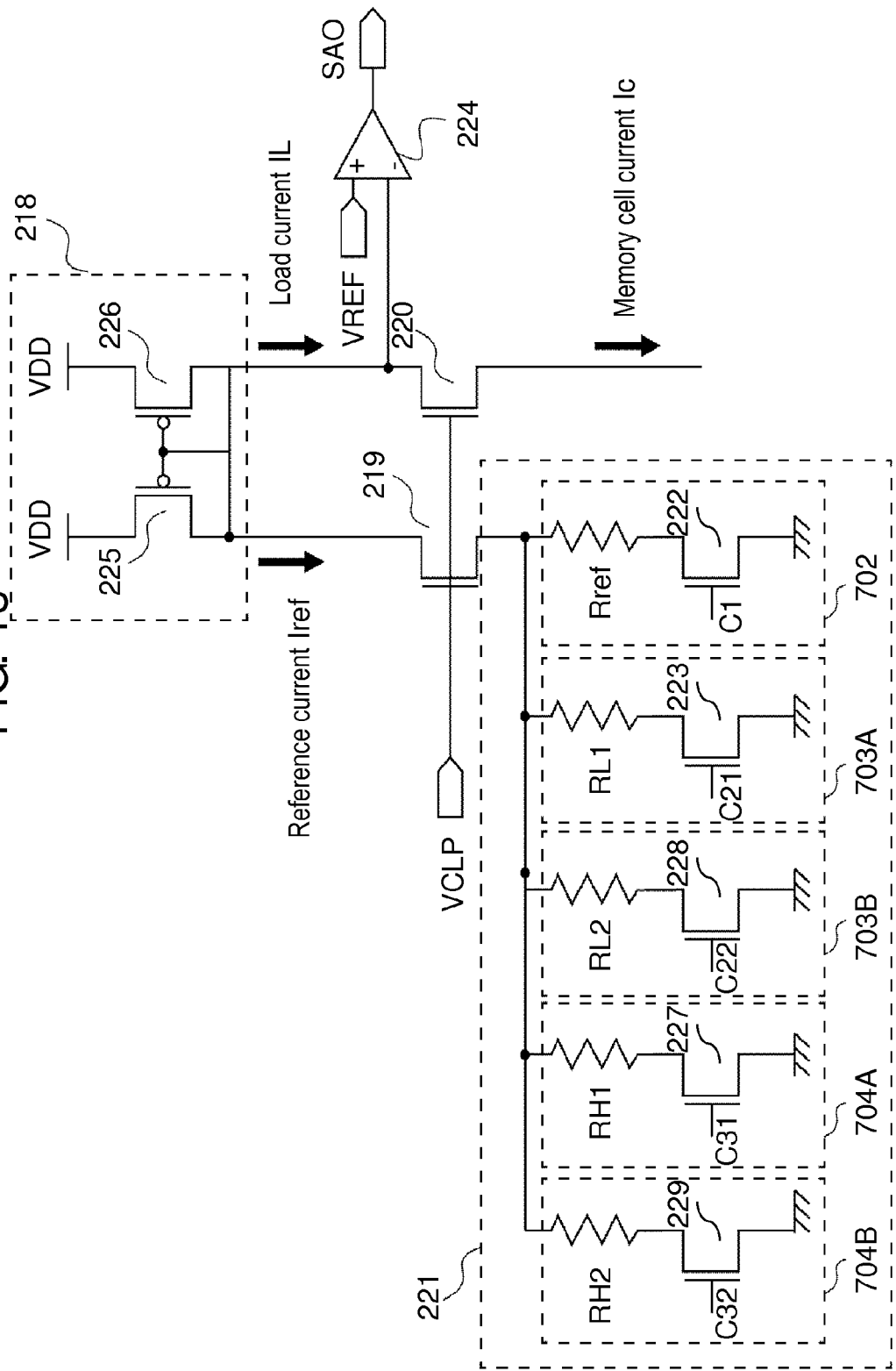
FIG. 18 is a circuit diagram showing one example of a schematic configuration of a sense amplifier provided in a variable resistance nonvolatile memory device according to a fourth embodiment.

FIG. 18 is a circuit diagram showing one example of a schematic configuration of sense amplifier 204 provided in the variable resistance nonvolatile memory device according to the fourth embodiment.

Sense amplifier 204 is, as one example, configured of current mirror circuit 218 with a mirror ratio of 1:1, clamp transistors 219, 220 having the same size, reference circuit 221, and differential amplifier 224. Reference circuit 221 is configured of reading reference current generation circuit 702, first low resistance writing reference current generation circuit 703A, second low resistance writing reference current generation circuit 703B, first high resistance writing reference current generation circuit 704A, and second high resistance writing reference current generation circuit 704B.

In reading reference current generation circuit 702, one end of a branch where selected transistor 222 is connected in series with reading reference resistor Rref is connected to the ground potential, and the other terminal is connected to a source terminal of clamp transistor 219. Further, read enable signal C1 is inputted into a gate terminal of selected transistor 222, and selected transistor 222 is switched by read enable signal C1 between a conduction state and a non-conduction state.

In first low resistance writing reference current generation circuit 703A, one end of a branch where selected transistor 223 is connected in series with first low-resistance verifying reference resistor RL1 (RL1<Rref) is connected to the ground potential, and the other terminal is connected to the source terminal of clamp transistor 219. First low-resistance verify enable signal C21 is inputted into a gate terminal of selected transistor 223, and selected transistor 223 is switched by first low-resistance verify enable signal C21 between the conduction state and the non-conduction state.

In second low resistance writing reference current generation circuit 703B, one end of a branch where selected transistor 228 is connected in series with second low-resistance verifying reference resistor RL2 (RL1<RL2<Rref) is connected to the ground potential, and the other terminal is connected to the source terminal of clamp transistor 219. Second low-resistance verify enable signal C22 is inputted into a gate terminal of selected transistor 228, and selected transistor 228 is switched by second low-resistance verify enable signal C22 between the conduction state and the non-conduction state.

Similarly, in first high resistance writing reference current generation circuit 704A, one end of a branch where selected transistor 227 is connected in series with first high-resistance verifying reference resistor RH1 (RH1>Rref) is connected to the ground potential, and the other terminal is connected to the source terminal of clamp transistor 219. First high-resistance verify enable signal C31 is inputted into a gate terminal of selected transistor 227, and selected transistor 227 is switched by first high-resistance verify enable signal C31 between the conduction state and the non-conduction state.

In second high resistance writing reference current generation circuit 704B, one end of a branch where selected transistor 229 is connected in series with second high-resistance verifying reference resistor RH2 (RH1>RH2>Rref) is connected to the ground potential, and the other terminal is connected to the source terminal of clamp transistor 219. Second high-resistance verify enable signal C32 is inputted into a gate terminal of selected transistor 229, and selected transistor 229 is switched by second high-resistance verify enable signal C32 between the conduction state and the non-conduction state.

Since the operations of clamp transistors 219, 220 are similar to those in the third reference mode, detailed descriptions thereof are omitted.

Figure 19:
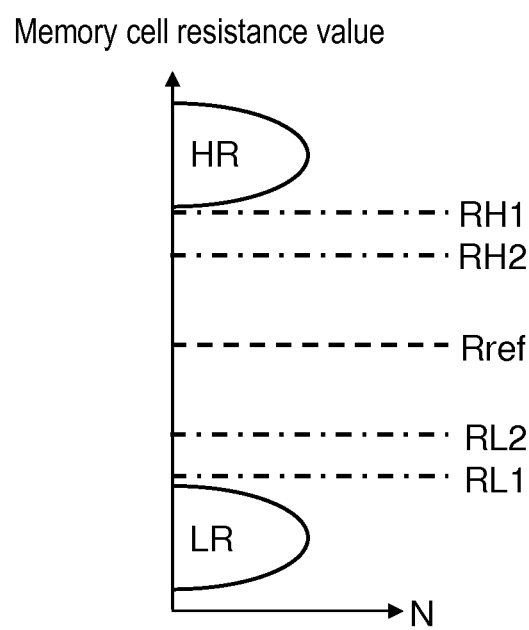
FIG. 19 is a schematic diagram showing a determination level of the sense amplifier in a method for writing into the variable resistance nonvolatile memory device according to the fourth embodiment.

FIG. 19 is a schematic diagram showing a determination level of the sense amplifier in a write method for the variable resistance nonvolatile memory device according to the fourth embodiment. As shown in FIG. 19, sense amplifier 204 has a determination level of reading reference resistor Rref between a resistance value of the memory cell being in the high-resistance state and a resistance value of the memory cell being in the low-resistance state. Further, sense amplifier 204 has determination levels of first low-resistance verifying reference resistor RL1 and second low-resistance verifying reference resistor RL2 which are lower than reading reference resistor Rref (RL1<RL2<Rref). Further, sense amplifier 204 has determination levels of first high-resistance verifying reference resistor RH1 and second high-resistance verifying reference resistor RH2 which are higher than reading reference resistor Rref (Rref<RH2<RH1).

It is to be noted that, although the configuration of having two each of low resistance writing reference current generation circuits and high resistance writing reference current generation circuits has been shown as one example in the above, there may also be formed: a configuration with one low resistance writing reference current generation circuit and two or more high resistance writing reference current generation circuits; a configuration with two or more low resistance writing reference current generation circuit and one high resistance writing reference current generation circuit, or a configuration with two or more each of low-resistance writing reference current generation circuits and high resistance writing reference current generation circuits. Further, it is also possible to use such a method as to provide only first low resistance writing reference current generation circuit 703A and first high resistance writing reference current generation circuit 704A, provide a transistor in place of the reference resistor, and control a resistance component by means of a value of a voltage that is applied to a gate of the transistor.

(2) Operation

Figure 20:
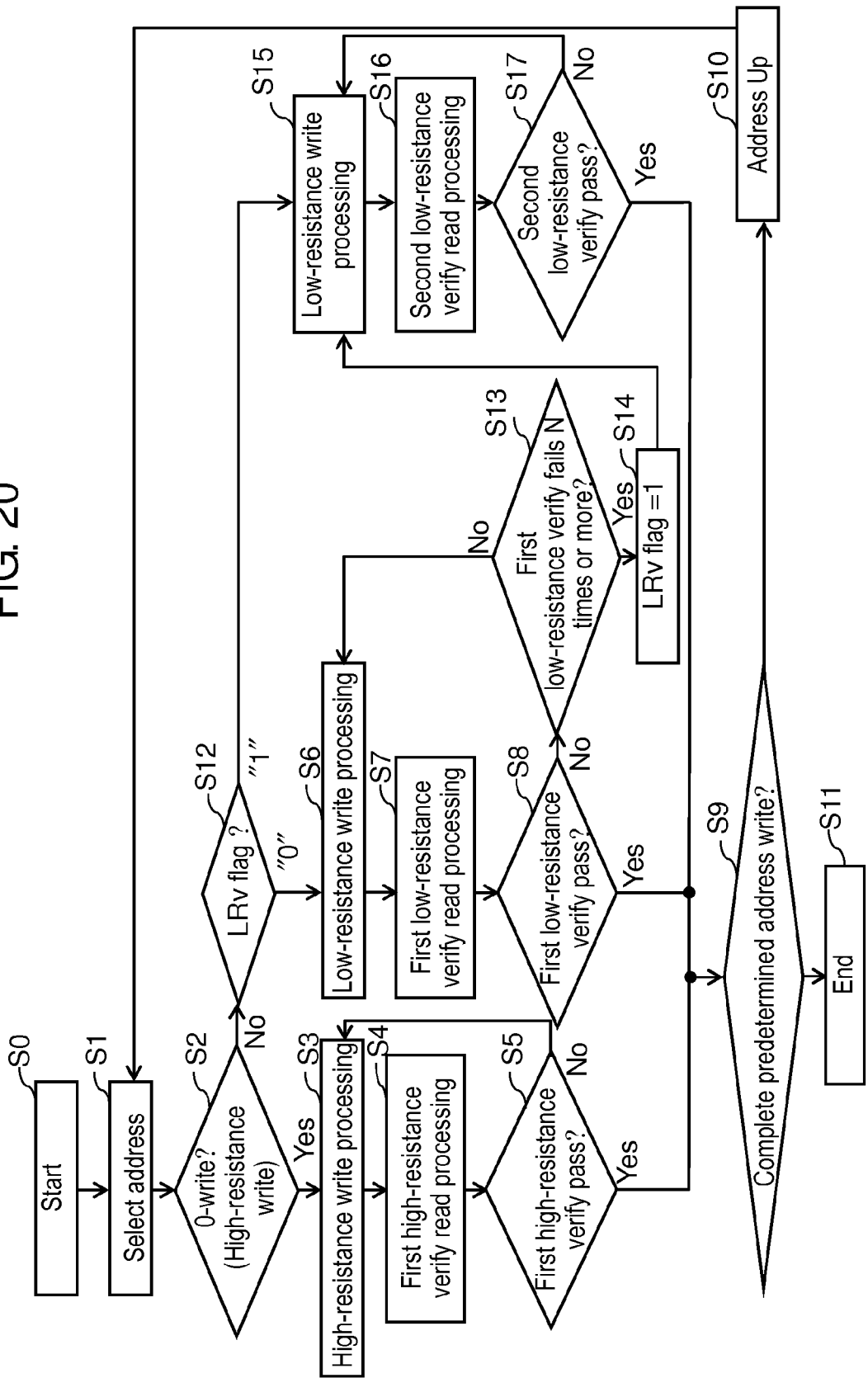
FIG. 20 is a flowchart showing the method for writing into the variable resistance nonvolatile memory device according to the fourth embodiment.

FIG. 20 is a flowchart showing a write method for the variable resistance nonvolatile memory device according to the fourth embodiment. With reference to FIGS. 19 and 20, a description will be given below of an operation method for and its effect of the variable resistance memory element of the fourth embodiment.

In FIG. 20, at the time of first performing write in a predetermined address space, a low-resistance verify flag (hereinafter, LRv flag) is set to 0. This LRv flag resistor may be provided inside variable resistance nonvolatile memory device 200 or may be provided inside a memory controller that supplies an address signal, a control signal and the like to variable resistance nonvolatile memory device 200, or inside an arithmetic unit.

When the flowchart is started (S0), a memory cell (e.g., M11) with an initial address of an address space where data is to be written is selected (S1). Then, in write circuit 206, in the case of performing "0" data-write (high-resistance write) (Yes in S2), high-resistance write processing for applying high resistance writing voltage pulse set 13 (see FIG. 11A) is executed (S3). Next, the selected memory cell is connected to sense amplifier 204, and first high-resistance verify read processing is performed (S4). The high-resistance write processing (S3) is repeated until the resistance value of the memory cell becomes higher than first high-resistance verifying reference resistor RH1 and the verify determination result becomes Pass (No in S5). In the case of Pass in the verify determination (Yes in S5), when there is a next address (No in S9), the processing shifts to write processing on the next address (S10), and when there is no next address (Yes in S9), the processing is completed (S11).

In S2, in the case of performing "1" data-write (low-resistance write) (No in S2), first, the LRv flag determination is performed (S12), and when the LRv flag is 0, low-resistance write processing for applying low resistance writing voltage pulse set 14 (see FIG. 11B) is executed (S6). The case of the LRv flag being 1 will be described later. Next, the selected memory cell is connected to sense amplifier 204, and first low-resistance verify read processing is performed (S7). When the resistance value of the memory cell is higher than first low-resistance verifying reference resistor RL1 (No in S8: verify Fail), the low-resistance write processing (S6) is repeated until the verify determination result becomes Pass.

In the above, when the number of times of Fail of verify results exceeds a specified number of times (N times) (Yes in S13), the LRv flag is set to 1 (S14), and thereafter, the low-resistance write processing is executed (S15). Next, the selected memory cell is connected to sense amplifier 204, and second low-resistance verify read processing is performed (S16). When the resistance value of the memory cell is higher than second low-resistance verifying reference resistor RL2 (No in S17), the low-resistance write processing (S15) is repeated until the verify determination result becomes Pass.

It is to be noted that the number of times of verify Fail may be previously stored in a resistor or the like provided inside variable resistance nonvolatile memory device 200. Further, the number of times of verify Fail may be previously stored in the memory controller that supplies an address signal, a control signal and the like to variable resistance nonvolatile memory device 200, or inside the arithmetic unit. These are similar to the case of the foregoing LRv flag.

In the LRv flag determination (S12), when the LRv flag is 1, low-resistance write processing for applying low resistance writing voltage pulse set 14 is executed (S15). Thereafter, the selected memory cell is connected to sense amplifier 204, and second low-resistance verify read processing is performed (S16). When the resistance value of the memory cell is higher than second low-resistance verifying reference resistor RL2 (No in S17), the low-resistance write processing (S15) is repeated until the verify determination result becomes Pass.

In the case of Pass in the first verify determination or the second verify determination (Yes in S8 or S17), when there is a next address (No in S9), the processing shifts to write processing on the next address (S10), and when there is no next address (Yes in S9), the processing is completed (S11).

After the LRv flag has once been set to 1, it is held being 1. That is, at the time of low-resistance write in the predetermined address space, when a memory cell occurs where the first low-resistance verify fails N times or more, hereafter in low-resistance write in the address space, the low-resistance verify determination is performed by use of second low-resistance verifying reference resistor RL2 which is higher (in a more relaxed condition) than first low-resistance verifying reference resistor RL1.

For low-resistance write, although the method for relaxing the verify determination in the case of the number of times of low-resistance verify Fail exceeding the specified number of times has been described above, this also applies to high-resistance write, and the above method may be applied to both low-resistance write and high-resistance write.

Fifth Exemplary Embodiment

A fifth embodiment has a similar device configuration to that of the fourth embodiment, and is only different therefrom in the operation method.

(1) Device Configuration

Since it is similar to that of the fourth embodiment, a detailed description thereof is omitted.

(2) Operation

Figure 21:
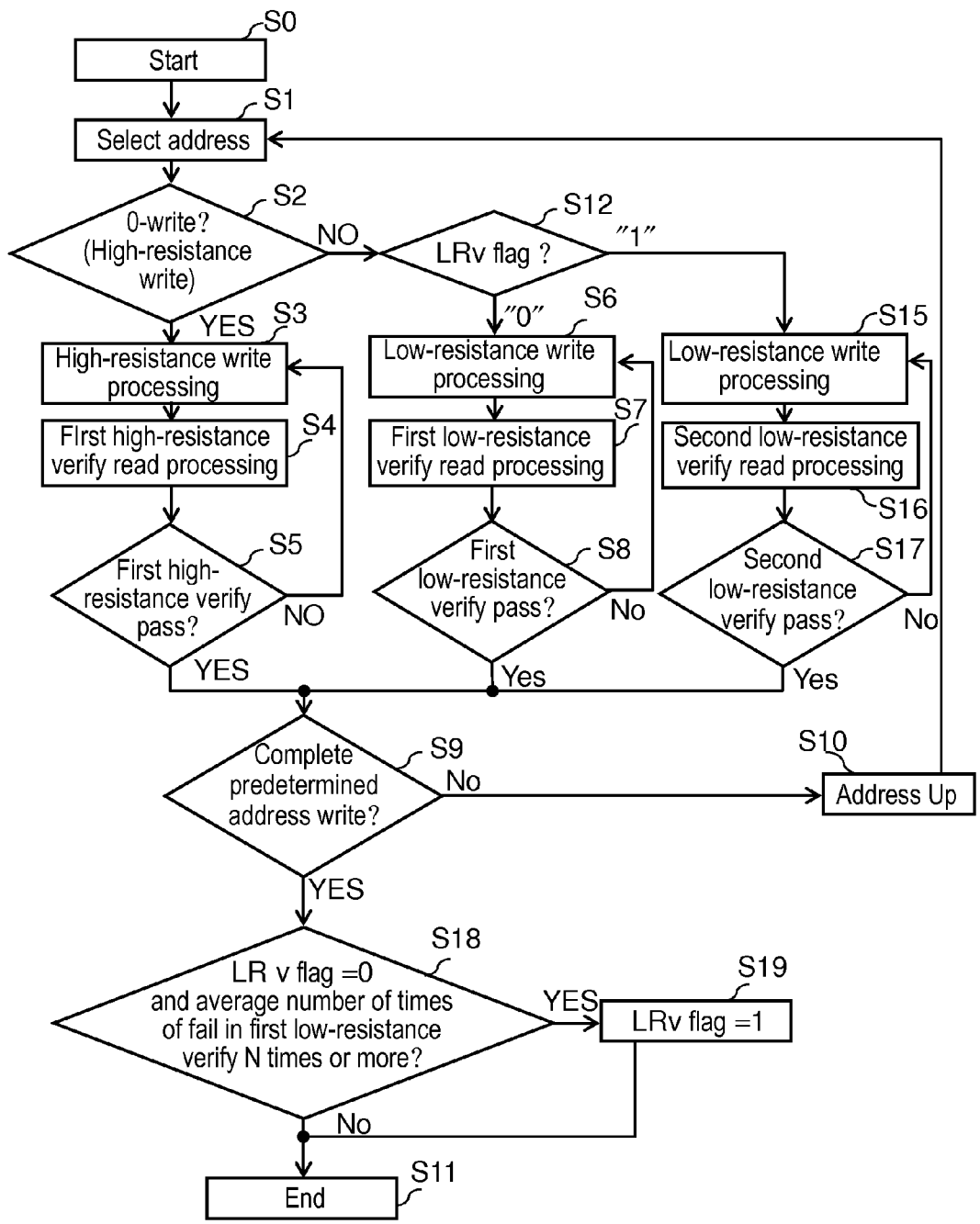
FIG. 21 is a flowchart showing a method for writing into a variable resistance nonvolatile memory device according to a fifth embodiment.

FIG. 21 is a flowchart showing a write method for a variable resistance nonvolatile memory device according to the fifth embodiment. Also in FIG. 21, at the time of first performing write in a predetermined address space, the LRv flag is set to 0 as in the case of FIG. 20.

When the flowchart is started (S0), a memory cell (e.g., M11) with an initial address of an address space where data is to be written is selected as shown in FIG. 2 (S1). Then, in write circuit 206, in the case of performing "0" data-write (high-resistance write) (Yes in S2), high-resistance write processing for applying high resistance writing voltage pulse set 13 (see FIG. 11A) is executed (S3). Next, the selected memory cell is connected to sense amplifier 204, and first high-resistance verify read processing is performed (S4). The high-resistance write processing (S3) is repeated until the resistance value of the memory cell becomes higher than first high-resistance verifying reference resistor RH1 and the verify determination result becomes Pass (No in S5). In the case of Pass in the verify determination (Yes in S5), when there is a next address (No in S9), the processing shifts to write processing on the next address (S10). When there is no next address (Yes in S9) and the LRv flag is 0, in the write operation, an average number of times of Fail in the first low-resistance verify of all memory cells, or part of memory cells, in the address space where data is to be written is determined (S18). When the average number of times of Fail in the first low-resistance verify exceeds a specified number of times (N times), the LRv flag is set to 1 (S19), and thereafter, the write operation is completed (S11). When the average number of times of Fail in the first low-resistance verify does not exceed the specified number of times (N times), write is completed (S11).

In S2, in the case of performing "1" data-write (low-resistance write) (No in S2), first, the LRv flag determination is performed, and when the LRv flag is 0, low-resistance write processing for applying low resistance writing voltage pulse set 14 (see FIG. 11B) is executed (S6). Next, the selected memory cell is connected to sense amplifier 204, and first low-resistance verify read processing is performed (S7). When the resistance value of the memory cell is higher than first low-resistance verifying reference resistor RL1 (No in S8), the low-resistance write processing (S6) is repeated until the verify determination result becomes Pass.

In the LRv flag determination (S12), when the LRv flag is 1, low-resistance write processing for applying low resistance writing voltage pulse set 14 is executed (S15). Thereafter, the selected memory cell is connected to sense amplifier 204, and second low-resistance verify read processing is performed (S16). When the resistance value of the memory cell is higher than second low-resistance verifying reference resistor RL2 (No in S17), the low-resistance write processing (S15) is repeated until the verify determination result becomes Pass.

In the case of Pass in the first verify determination or the second verify determination (Yes in S8 or S17), when there is a next address (No in S9), the processing shifts to write processing on the next address (S10), and a similar operation to the above is performed on the memory cell with the next address.

When there is no next address (Yes in S9) and the LRv flag is 0, in the write operation, an average number of times of Fail in the first low-resistance verify of all memory cells, or part of memory cells, in the address space where data is to be written is determined (S18). When the average number of times of Fail in the first low-resistance verify exceeds a specified number of times (N times), the LRv flag is set to 1 (S19), and thereafter, the write operation is completed (S11).

After the LRv flag has once been set to 1, it is held being 1. That is, at the time of low-resistance write, when the average number of times of Fail in the first low-resistance verify of all the memory cells, or part of the memory cells, in the address space where data is to be written is N times or more, hereafter in low-resistance write in the address space, the low-resistance verify determination is performed by use of second low-resistance verifying reference resistor RL2 which is higher (in a more relaxed condition) than first low-resistance verifying reference resistor RL1.

For low-resistance write, although the method for relaxing the verify determination in the case of the number of times of low-resistance verify Fail exceeding the specified number of times has been described above, this also applies to high-resistance write, and the above method may be applied to both low-resistance write and high-resistance write.

(3) Conclusion

Next, a description will be given of a circuit operation result and its problem in the case of using the circuit configuration and the circuit operation of the fifth embodiment described above.

As described above, when the first low-resistance verify fails N times or more on average, in the case of hereafter performing low-resistance write in the predetermined address space, the low-resistance verify determination is performed by use of second low-resistance verifying reference resistor RL2 which is higher (in a more relaxed condition) than first low-resistance verifying reference resistor RL1, thereby allowing suppression of an increase in number of times of low-resistance verify.

Figure 22:
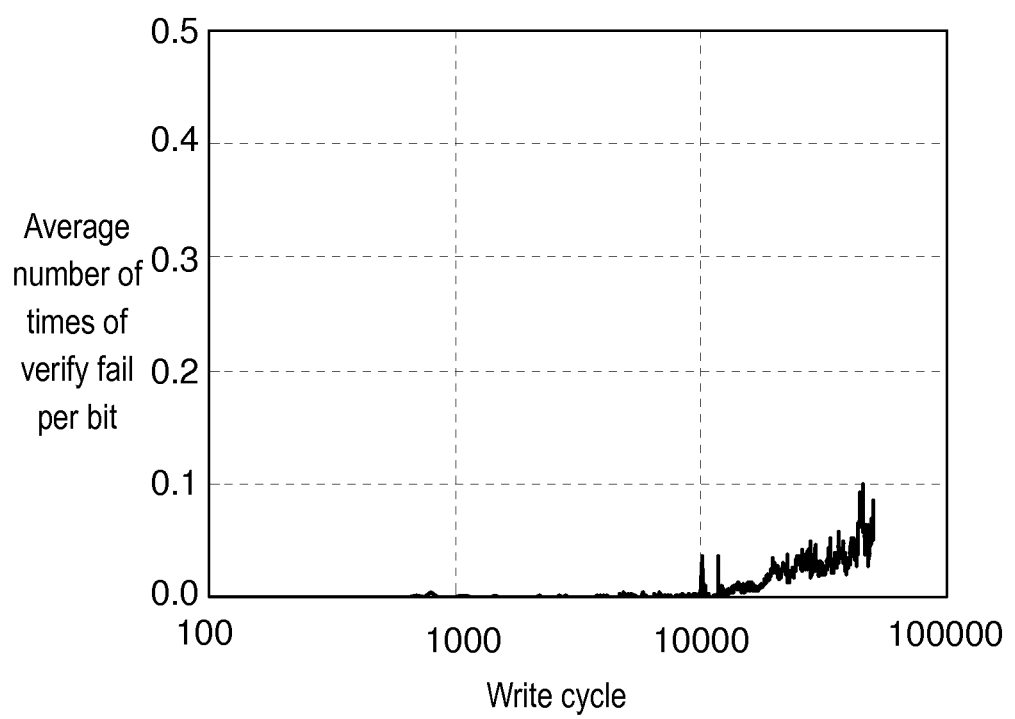
FIG. 22 is a diagram showing a shift of an average number of times per bit in the verify write operation in a case where high resistance writing and low resistance writing is repeated in the variable resistance nonvolatile memory device according to the fifth embodiment.

FIG. 22 is a diagram showing a shift of an average number of times per bit in the verify write operation in a case where increasing and lowering resistance is repeated in the variable resistance nonvolatile memory device according to the fifth embodiment. That is, FIG. 22 shows a shift of an average number of times of Fail per bit in the low-resistance verify operation after setting of the LRv flag to 1 in the case of using the operation method of FIG. 21. Here, a threshold of the average number of times of verify where the LRv flag is set to 1, namely N of S18 in FIG. 21 is set to 0.1, and second low-resistance verifying reference resistor RL2 is set to 9.4 kΩ. It is to be noted that a shift of the average number of times of Fail per bit in the low-resistance verify operation before setting of the LRv flag to 1 is similar to the shift until 7600 times in FIG. 17.

From FIG. 22, it can be verified that, when the average number of times of Fail per bit in the low-resistance verify operation exceeds 0.1 time, by changing the low-resistance verifying reference resistor to RL2 which is higher than RL1, namely by relaxing the low-resistance verify determination, the average number of times of Fail in the vicinity of 50000 times is suppressed to 0.1 time or less.

However, relaxing the low-resistance verifying reference resistor from RL1 (7.5 kΩ) to RL2 (9.4 kΩ) leads to deterioration in convergence properties of the cell current after low-resistance write.

Figure 23:
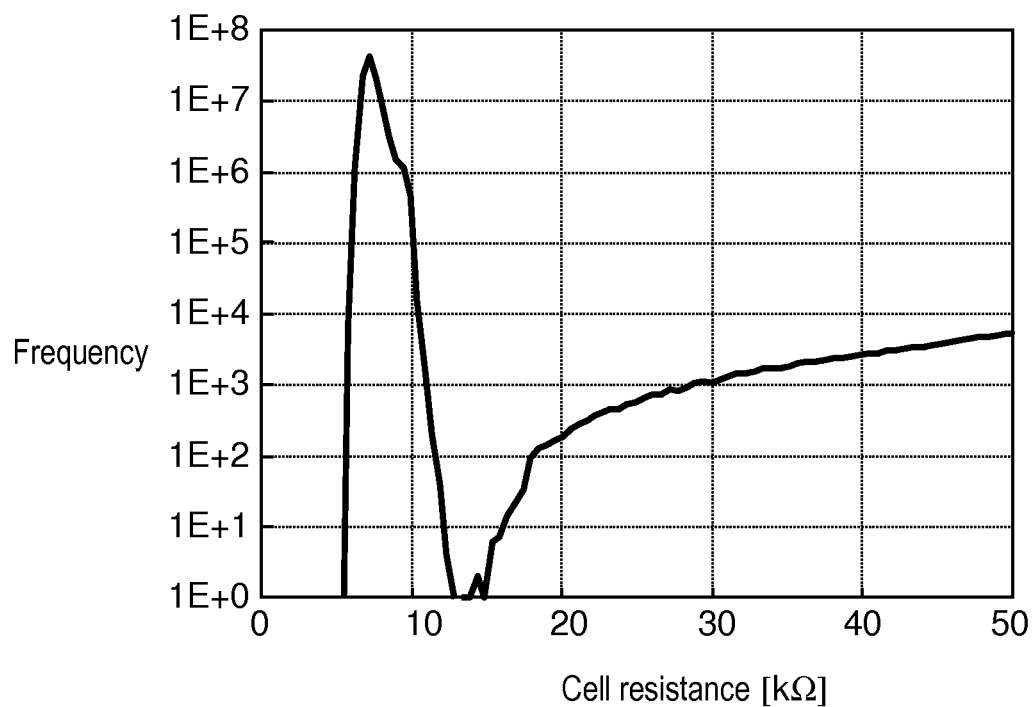
FIG. 23 is a diagram showing a resistance value frequency distribution in a case where high resistance writing and low resistance writing is repeated 50000 times in the variable resistance nonvolatile memory device (1 k bits) according to the fifth embodiment.

FIG. 23 is a diagram showing a resistance value frequency distribution in a case where increasing and lowering resistance is repeated 50000 times in the variable resistance nonvolatile memory device (1 k bits) according to the fifth embodiment. FIG. 23 shows a result of measuring an accumulated total distribution of cell currents immediately after the high-resistance verify (S5) Pass and the low-resistance verify (S8) Pass after setting of the LRv flag to 1 in the 1 k-bit memory array in the above operation until 50000 times. FIG. 23 shows that the window has disappeared due to deterioration in convergence properties on the low-resistance side.

Figure 24:
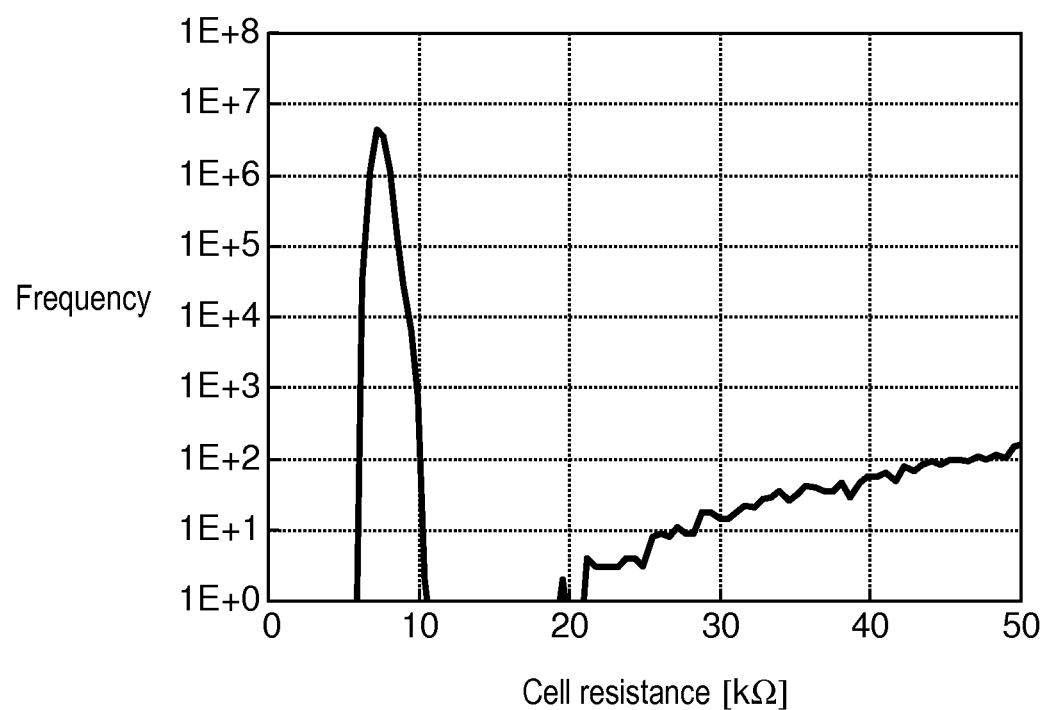
FIG. 24 is a diagram showing a resistance value frequency distribution in a case where high resistance writing and low resistance writing is repeated 10000 times in the variable resistance nonvolatile memory device (1 k bits) according to the fifth embodiment.

FIG. 24 is a diagram showing a resistance value frequency distribution in a case where increasing and lowering resistance is repeated 10000 times in the variable resistance nonvolatile memory device (1 k bits) according to the fifth embodiment. FIG. 24 shows an accumulated total distribution of cell currents immediately after the high-resistance verify (S5) Pass and the low-resistance verify (S8) Pass after setting of the LRv flag to 1 in the above operation until 10000 times (1 k bits×10000 times).

It can be verified that the window is sufficiently ensured until 10000 times as shown in FIG. 24. That is, it is found from FIGS. 23 and 24 that, after relaxation of the low-resistance verifying reference resistor from RL1 to RL2, 50000 times of operations cannot be performed but 10000 times of operations can be performed.

Therefore, in a memory region where the number of times of Fail in the low-resistance verify operations exceeds a specified number and the LRv flag is set to 1, an upper limit may be set to the number of times of write to be performed hereafter (e.g., 10000 times in the above case). A memory region where the number of times of write has reached the upper limit may be forbidden to be used hereafter, or may be enabled to ensure a window again by returning the low-resistance verifying reference resistor from RL2 to RL1. Hence, it is possible to seek extended lifetime of the variable resistance element. However, in the latter case, since the number of times of verify increases and the write speed decreases, the use of this case needs to be restricted to one at a low speed.

It is to be noted that, although the so-called 1T1R type memory cell where one variable resistance element is connected to the NMOS transistor as the switch element has been used in the configuration of the memory element shown in FIG. 8, the present disclosure is not restricted to this 1T1R type memory cell. For example, it may be applied as a switch element to a 1D1R type memory cell using a bidirectional diode.

From the above description, a number of modifications and other embodiments of the present disclosure are obvious for the person skilled in the art. Accordingly, the above description should be construed only as an exemplification, and is to be provided for the purpose of instructing the person skilled in the art in the best mode for carrying out the present disclosure. It is possible to substantially change details of the structure and/or function of the present disclosure without deviating from the spirit thereof.

One aspect of the present disclosure is useful as a variable resistance nonvolatile memory device and a write method for the same, which are capable of realizing both improvement in data-record/read accuracy and improvement in data-write speed.

What is claimed is:

1. A method for writing information into a variable resistance nonvolatile memory device including a variable resistance element, the method comprising:
   (A) applying an initial voltage pulse to the variable resistance element for changing a resistance value of the variable resistance element;
   (B) performing a first verify operation at least once after applying the initial voltage pulse, the first verify operation including
      (b1) reading the resistance value of the variable resistance element,
      (b2) determining whether or not the read resistance value satisfies a first determination condition, and
      (b3) applying a voltage pulse to the variable resistance element when the read resistance value does not satisfy the first determination condition;
   (C) stopping the first verify operation when a number of times of the first verify operation exceeds a predetermined number; and
   (D) performing a second verify operation at least once when the number of times of the first verify operation exceeds the predetermined number, the second verify operation including
      (d1) reading the resistance value of the variable resistance element,
      (d2) determining whether or not the read resistance value satisfies a second determination condition that is looser than the first determination condition, and
      (d3) applying the voltage pulse to the variable resistance element when the read resistance value does not satisfy the second determination condition.

2. The method according to claim 1, wherein:
   in the first verify operation, the read resistance value is determined not to satisfy the first determination condition when the read resistance value is higher than a first threshold value,
   in the second verify operation, the read resistance value is determined not to satisfy the second determination condition when the read resistance value is higher than a second threshold value, and
   the second threshold value is higher than the first threshold value.

3. The method according to claim 1, wherein:
   in the first verify operation, the read resistance value is determined not to satisfy the first determination condition when the read resistance value is lower than a third threshold value,
   in the second verify operation, the read resistance value is determined not to satisfy the second determination condition when the read resistance value is lower than a fourth threshold value, and
   the fourth threshold value is lower than the third threshold value.

4. The method according to claim 2, wherein:
   the initial voltage pulse is for changing the variable resistance element from a first resistance state to a second resistance state having a lower resistance value than the first resistance state does, and
   the second threshold value is lower than a reading reference resistance value that is a reading criterion for determining whether the variable resistance element is in the first resistance state or the second resistance state.

5. The method according to claim 3, wherein:
   the initial voltage pulse is for changing the variable resistance element from a second resistance state to a first resistance state having a higher resistance value than the second resistance state does, and
   the fourth threshold value is higher than a reading reference resistance value that is a reading criterion for determining whether the variable resistance element is the first resistance state or the second resistance state.

6. The method according to claim 1, wherein the voltage pulse is different from the initial voltage pulse in a voltage value or a pulse width.

7. The method according to claim 1, wherein the voltage pulse is same as the initial voltage pulse in a voltage value and a pulse width.

8. The method according to claim 1, further including
   (E) stopping the performance of the second verify operation when the number of times of the second verify operation reaches a predetermined upper limit.

9. The method according to claim 8, further comprising:
   (F) performing a third verify operation at least once after the number of times of the second verify operation reaches the predetermined upper limit, the third verify operation including (f1) reading the resistance value of the variable resistance element, (f2) determining whether or not the read resistance value satisfies the first determination condition, and (f3) applying a voltage pulse to the variable resistance element when the read resistance value does not satisfy the first determination condition.

10. A variable resistance nonvolatile memory device comprising:

a memory cell array including a variable resistance element; and pulse application circuitry operative to:

(A) apply an initial voltage pulse to the variable resistance element for changing a resistance value of the variable resistance element;

(B) perform a first verify operation at least once after applying the initial voltage pulse, the first verify operation including (b1) reading the resistance value of the variable resistance element, (b2) determining whether or not the read resistance value satisfies a first determination condition, and (b3) applying a voltage pulse to the variable resistance element when the read resistance value does not satisfy the first determination condition; and (C) stop the first verify operation when a number of times of the first verify operation exceeds the predetermined number; and (D) perform a second verify operation at least once when the number of times of the first verify operation exceeds a predetermined number, the second verify operation including (d1) reading the resistance value of the variable resistance element, (d2) determining whether or not the read resistance value satisfies a second determination condition that is looser than the first determination condition, (d3) applying the voltage pulse to the variable resistance element when the read resistance value does not satisfy the second determination condition.

11. The variable resistance nonvolatile memory device according to claim 10, wherein:

in the first verify operation, the read resistance value is determined not to satisfy the first determination condition when the read resistance value is higher than a first threshold value, in the second verify operation, the read resistance value is determined not to satisfy the second determination condition when the read resistance value is higher than a second threshold value, and the second threshold value is higher than the first threshold value.

12. The variable resistance nonvolatile memory device according to claim 10, wherein:

in the first verify operation, the read resistance value is determined not to satisfy the first determination condition when the read resistance value is lower than a third threshold value, in the second verify operation, the read resistance value is determined not to satisfy the second determination condition when the read resistance value is lower than a fourth threshold value, and the fourth threshold value is lower than the third threshold value.

13. The variable resistance nonvolatile memory device according to claim 11, wherein:

the initial voltage pulse is for changing the variable resistance element from a first resistance state to a second resistance state having a lower resistance value than the first resistance state does, and the second threshold value is lower than a reading reference resistance value that is a reading criterion for determining whether the variable resistance element is in the first resistance state or the second resistance state.

14. The variable resistance nonvolatile memory device according to claim 12, wherein:

the initial voltage pulse is for changing the variable resistance element from a second resistance state to a first resistance state having a higher resistance value than the second resistance state does, and the fourth threshold value is higher than a reading reference resistance value that is a criterion for determining whether the variable resistance element is the first resistance state or the second resistance state.

15. The variable resistance nonvolatile memory device according to claim 10, wherein the voltage pulse is different from the initial voltage pulse in a voltage value or a pulse width.

16. The variable resistance nonvolatile memory device according to claim 10, wherein the voltage pulse is same as the initial voltage pulse in a voltage value and a pulse width.

17. The variable resistance nonvolatile memory device according to claim 10, wherein the second verify operation further includes (E) stopping the performance of the second verify operation when a number of times of the second verify operation reaches a predetermined upper limit.

18. The variable resistance nonvolatile memory device according to claim 17, wherein the pulse application circuitry is further operative to: (F) perform a third verify operation at least once after the number of times of the second verify operation reaches the predetermined upper limit, the third verify operation including (f1) reading the resistance value of the variable resistance element, (f2) determining whether or not the read resistance value satisfies the first determination condition, and (f3) applying a voltage pulse to the variable resistance element when the read resistance value does not satisfy the first determination condition.

\* \* \* \* \*